United States Patent
Magomedov et al.

(10) Patent No.: US 12,207,546 B2
(45) Date of Patent: Jan. 21, 2025

(54) HOLE-TRANSPORTING SELF-ORGANIZED MONOLAYER FOR PEROVSKITE SOLAR CELLS

(71) Applicants: HELMHOLTZ-ZENTRUM BERLIN FÜR MATERIALIEN UND ENERGIE GMBH, Berlin (DE); KAUNAS UNIVERSITY OF TECHNOLOGY, Kaunas (LT)

(72) Inventors: Artiom Magomedov, Kaunas (LT); Amran Al-Ashouri, Berlin (DE); Ernestas Kasparavicius, Kaunas (LT); Steve Albrecht, Werder Havel (DE); Vytautas Getautis, Kaunas (LT); Marko Jost, Berlin (DE); Tadas Malinauskas, Kaunas (LT); Lukas Kegelmann, Berlin (DE); Eike Köhnen, Berlin (DE)

(73) Assignees: HELMHOLTZ-ZENTRUM BERLIN FÜR MATERIALIEN UND ENERGIE GMBH, Berlin (DE); KAUNAS UNIVERSITY OF TECHNOLOGY, Kaunas (LT)

(*) Notice: Subject to any disclaimer, the term of this patent is extended or adjusted under 35 U.S.C. 154(b) by 1052 days.

(21) Appl. No.: 17/256,052

(22) PCT Filed: Apr. 25, 2019

(86) PCT No.: PCT/EP2019/060586
§ 371 (c)(1),
(2) Date: Apr. 7, 2021

(87) PCT Pub. No.: WO2019/207029
PCT Pub. Date: Oct. 31, 2019

(65) Prior Publication Data
US 2021/0234101 A1    Jul. 29, 2021

(30) Foreign Application Priority Data

Apr. 25, 2018 (EP) .................................. 18000405
Jun. 26, 2018 (DE) .................... 10 2018 115 379.1

(51) Int. Cl.
*H10K 85/60* (2023.01)
*C07F 9/38* (2006.01)
(Continued)

(52) U.S. Cl.
CPC ......... *H10K 85/636* (2023.02); *C07F 9/3873* (2013.01); *C07F 9/5728* (2013.01);
(Continued)

(58) Field of Classification Search
None
See application file for complete search history.

(56) References Cited

U.S. PATENT DOCUMENTS 9,130,176 B2 * 9/2015 Otsuki ................ H10K 71/135
2010/0051917 A1 3/2010 Kippelen
(Continued)

FOREIGN PATENT DOCUMENTS

CN 107163078 9/2017
JP 2016129224 7/2016
(Continued)

OTHER PUBLICATIONS

Sun, J. et al., "High Efficiency and High Voc Inverted Polymer Solar Cells Based on a Low-Lying HOMO Polycarbazole Donor and a Hydrophilic Polycarbazole Interlayer on ITO Cathode", The Journal of Physical Chemistry C, Band 116, 2012, Seite 14188-14198.
(Continued)

*Primary Examiner* — Hsien Ming Lee
(74) *Attorney, Agent, or Firm* — JMB Davis Ben-David

(57) ABSTRACT

The present invention addresses uniformly formed layers on TCOs with minimized thickness which are hole transport-
(Continued)

Figure 1:
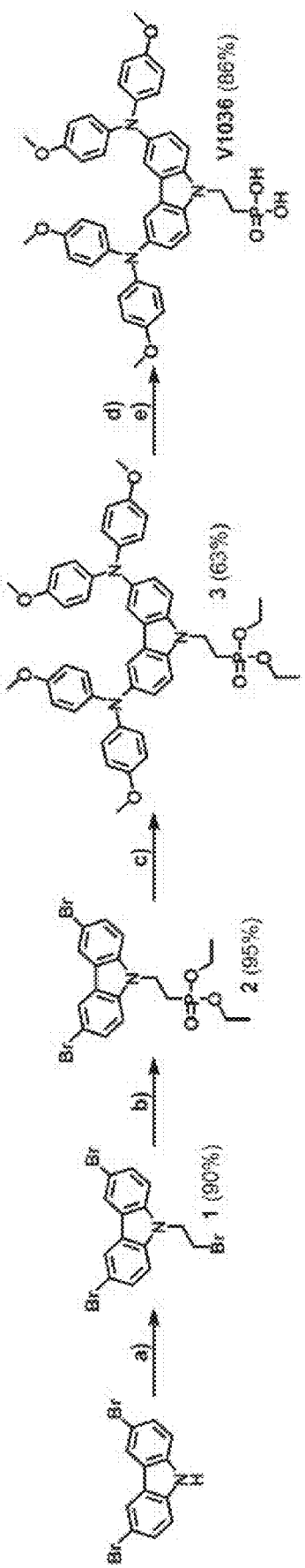

ing, due to a hole transport material which is configured for self assembly on the corresponding surface. The layers are formed by a compound made up of at least one kind of molecule according to formula (I) mixed up with a filler molecule FM given by

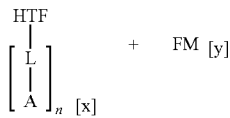
(I)

where L is a linking fragment, A an anchor group and HTF is a hole transporting fragment. FM (filler molecule) is at least one kind of molecule consisting of an anchoring group, an alkyl chain of N carbon atoms, with N is in the range of 1 to 18, and a functional group of at least on of the group methyl, halogen, amino, bromide, ammonium and sulfuric functional group and where x is in the range of 0.02 to 1 and y equals (1−x).

15 Claims, 10 Drawing Sheets

(51) Int. Cl.
- C07F 9/572 (2006.01)
- C09D 5/24 (2006.01)
- C09D 7/63 (2018.01)
- H01G 9/00 (2006.01)
- H01G 9/20 (2006.01)
- H10K 30/30 (2023.01)
- H10K 30/82 (2023.01)
- H10K 71/12 (2023.01)
- H10K 71/40 (2023.01)
- H10K 102/10 (2023.01)

(52) U.S. Cl.
CPC ........... *C09D 5/24* (2013.01); *C09D 7/63* (2018.01); *H01G 9/0036* (2013.01); *H01G 9/2009* (2013.01); *H01G 9/2018* (2013.01); *H10K 30/30* (2023.02); *H10K 30/82* (2023.02); *H10K 71/12* (2023.02); *H10K 71/40* (2023.02); *H10K 85/633* (2023.02); *H10K 85/6572* (2023.02); *H10K 2102/103* (2023.02)

(56) References Cited

U.S. PATENT DOCUMENTS

| | | | |
|---|---|---|---|
| 2016/0181541 A1† | 6/2016 | Lee | |
| 2016/0308141 A1* | 10/2016 | Radu | C08G 61/12 |
| 2017/0077433 A1 | 3/2017 | Gotanda et al. | |

FOREIGN PATENT DOCUMENTS

| | | |
|---|---|---|
| JP | 2017059643 | 3/2017 |
| KR | 10-1458691 † | 11/2014 |
| WO | 2006131873 | 12/2006 |
| WO | 2016080226 | 5/2016 |

OTHER PUBLICATIONS

Zhang, Z. et al., "Phosphate ester side-chain-modified conjugated polymer for hybrid solar cells", Journal of Applied Polymer Science,2017, Seite 45003(1)-45003(7).
Chen, D. et al., "Novel Cathode interlayers based on Neutral Alcohol-Solue Small Molecules with a Triphenylamine Core featuring Polar Phosphonate Side Chains for High-Performance Polymer Light-Emitting and Photovoltaic Devices", Macromolecular Rapid Communication,Band 34, 2013, Seite 595-603.
Liu, J. et al., "Printable Highly Conductive Conjugated Polymer Sensitized ZnO NCs Cathode Interfacial Layer for Efficient Polymer Solar Cells", Applied Materials & Interfaces,Band 6, 2014, Seite 8237-8245.
Xioayan et al "Nona- and undecanuclear nickel phosphonate cages" Jan. 2016, Inorganica Chimica Acta 439:77-81 DOI:10.1016/j.ica.2015.10.003.
Bardecker et al Self-assembled electroactive phosphonic acids on ITO: maximizing hole-injection in polymer light-emitting diodes**, Dec. 2008, Advanced Functional Materials 18(24):3964-3971 DOI:10.1002/adfm.200800033.
Kosolapof et al.: "Synthesis of phosphorous derivates of several heterocyclic compounds", Journal of General Chemistry of the USSR, 38, 7, 1968, pp. 1467-1469.
Sun et al., "High Efficiency and High Voc Inverted Polymer Solar Cells Based-on a Low-Lying HOMO Polycarbazole Donor and a Hydrophilic Polycarbazole Interlayer on ITO Cathode", J. Phys. Chem., Jun. 12, 2012.†

* cited by examiner
† cited by third party

A)

B)

A)

B)

HOLE-TRANSPORTING SELF-ORGANIZED MONOLAYER FOR PEROVSKITE SOLAR CELLS

CROSS-REFERENCE TO RELATED APPLICATIONS

This is the U.S. National Stage of International Patent Application No. PCT/EP2019/060586 filed Apr. 25, 2019, which was published in German under PCT Article 21(2), and which in turn claims the benefit of European Patent Application No. EP 18000405.3 filed Apr. 25, 2018, and German Patent Application No. DE 10 2018 115 379.1 filed Jun. 26, 2018.

PRIOR ART

Solar cells with the hybrid perovskite absorbing layer in a strikingly short period of time have surpassed 20% power conversion efficiency (PCE) limit, reaching the record efficiency of 22.7% ("NREL efficiency chart," https://www.nrel.gov/pv/assets/images/efficiency-chart.png, 26.06.2018). Published record results for the perovskite solar cells (PSCs) (W. S. Yang et al., Science 2017, 356, 1376-1379) were achieved in n-i-p (in literature often referred to as "regular" PSCs) configuration with a $TiO_2$ (compact and mesoporous layers) as an electron transporting material, deposited on transparent conductive oxide (TCO) substrate. For the p-i-n configuration (in literature often referred to as "inverted" PSCs), where on TCO first hole transporting materials (HTMs) are deposited, also over 20% efficiencies are reported (J. Zhao et al., Energy Environ. Sci. 2016, 9, 3650-3656 and M. Stolterfoht et al. Energy Environ. Sci. 2017, 10, 1530-1539) making it a good competitor. All these results inspire more research in this fast-developing field.

The p-i-n PSCs have several advantages in comparison to the more popular n-i-p architecture. First, high temperature annealing, required for the $TiO_2$ formation, is avoided. Second, they are known to have much less pronounced hysteresis, leading to virtually "hysteresis-free" devices (J. H. Heo et al., Energy Environ. Sci. 2015, 8, 1602-1608), even though it can still be detected under certain conditions (D. Bryant et al., J. Phys. Chem. Lett. 2015, 6, 3190-3194 and P. Calado, Nat. Commun. 2016, 7, 13831). Third, much cheaper copper can be used instead of gold as a metal contact layer (J. Zhao et al., J. Huang, Energy Environ. Sci. 2016, 9, 3650-3656). Next, no doping is needed for the charge selective contacts which might improve the long term stability as dopants of spiro-OMeTAD (2,2',7,7'-tetrakis-(N,N-di-p-methoxyphenylamine)9,9'-spirobifluorene) are known to reduce stability. Finally, the p-i-n configuration was shown to enable higher tandem efficiency potential due to less parasitic absorption in the front contact (K. A. Bush et al., 23.6%-efficient monolithic perovskite/silicon tandem solar cells with improved stability, nature energy Vol. 2, 2017, 17009_1-7) and thus p-i-n PSCs have a great potential for the further development.

In a recent work (Stolterfoht et al., Energy Environ Sci. 2017, 10 (6), 1530) it was shown that a reduction of the HTM film thickness leads to the increase in the fill factor (FF). However, as the films are getting thinner, open-circuit voltage (Voc) sharply drops, possibly due to the incomplete coverage of indium tin oxide (ITO), leading to a direct contact between perovskite and ITO.

Recently, several works were published by Y. Hou et.al. on the use of the phosphonic acid-based mixed $C_{60}$/organic self assembling monolayer (SAM) as an electron transporting material in the n-i-p PSC instead of $TiO_2$ (Y. Hou et al., Adv. Mater. Interfaces 2017, 4, 1700007 and Y. Hou et al., Science 2017, 358, 1192-1197). Also, in a similar fashion siloxane-functionalized $C_{60}$ SAMs were used by P. Topolovsek et.al. (J. Mater. Chem. A 2017, 5, 11882-11893).

SUMMARY OF THE INVENTION

The present invention addresses uniformly formed layers on TCOs with minimized thickness which are hole transporting, due to a hole transport material which is configured for self assembly on the corresponding surface. In addition, minimal parasitic absorption, reduced material consumption and the avoidance of doping procedures are problems to be solved, especially with respect to the provision of scalable techniques.

Moreover, the present invention pursues to provide HTMs which are relatively tolerant against perovskite processing and could cover conformally on every textured surface such as textured silicon with several micron high pyramids that were processed by wet chemical etching typically used in solar cells.

Accordingly, one aspect of the present invention is to provide a compound comprising at least one molecule of formula (I) functioning as the HTM:

where L is a linking fragment, A an anchor group and HTF is a hole transporting fragment being selected from any of formula II or III,
a polycycle $$Z-D-Z \qquad (II),$$

wherein Z and D are homocyclic or at least one of Z or D includes a heteroatom selected from the group of N, S, O, Si and Z is a $C_5$ or $C_6$ substituted or not substituted aromatic group, D is N or a $C_5$ or $C_6$ aromatic group, wherein two carbon atoms of aromatic group D are each bonded to one of the two aromatic groups Z to form a tricycloundecane, a tricyclotridecane or a tricyclotetradecane derivative; or

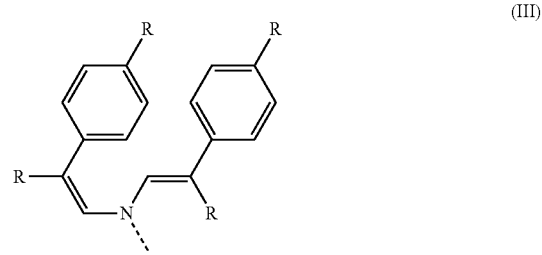

and R is a substituent.

The compound according to the invention functions as a hole transport material due to the electron localization. Therefore, connections that enable electron localization across the entire system are essentially preferred. In particular, delocalization between the Z fragments via fragment D. For this purpose, D prefers an aromatic fragment and/or an element with an electron-pushing character, which is in conjunction to the fragments Z. Particularly preferred, are symmetrical structures, i.e. connections that can be mirrored along an axis. Mirroring refers to the schematic structure and not necessarily to the actual steric appearance.

It is advantageous that the mirror axis runs through component D, so that the two Z components are equal or inverse.

For the formation of a SAM, the molecule of formula (I) can be mixed with other molecules, referred to as "filler molecules" FM. The FM is generally a molecule or a mixture of molecules consisting of an anchoring group (e.g. phosphonic acid, phosphoric acid, sulfuric acid, sulfonic acid, carboxylic acid, siloxanes), which can bind to the surface of the TCO, an alkyl chain of N carbon atoms, where N=1-18, and a methyl, halogen, amino, bromide, ammonium and/or sulfuric functional group. Examples are ethyl- or butylphosphonic acid ("C2" or "C4"), or (Aminomethyl) phosphonic acid. The FM functions as a passivation agent, reducing charge carrier recombination between the TCO and perovskite, as well as an agent for modification of the wettability of the TCO. A preparation without FMs is always possible and with properly selected parts of HTF, L and A comes without detriment.

The ratio of HTM in the mixture is given by x in the range of 0.02 to 1. The ratio of the filler molecule FM is given by y=(1−x). For the HTM of formula (I) n is preferably equal to 1 or 2.

In preferred embodiments of the invention D is a $C_5$- or $C_6$-heteroaromatic group, wherein the heteroatom is N, Si, S and/or O.

In further preferred embodiments the hole transport fragment HTF is selected from any one of formula IV to XIX

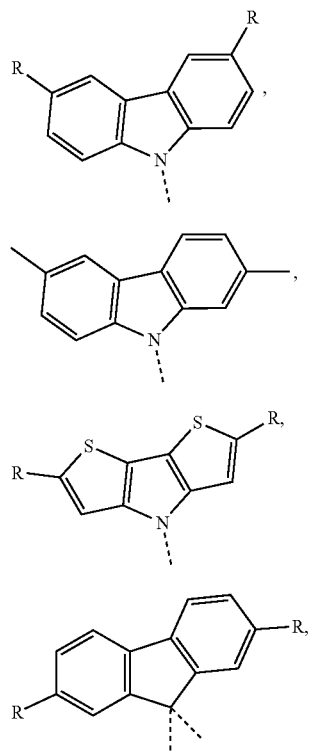

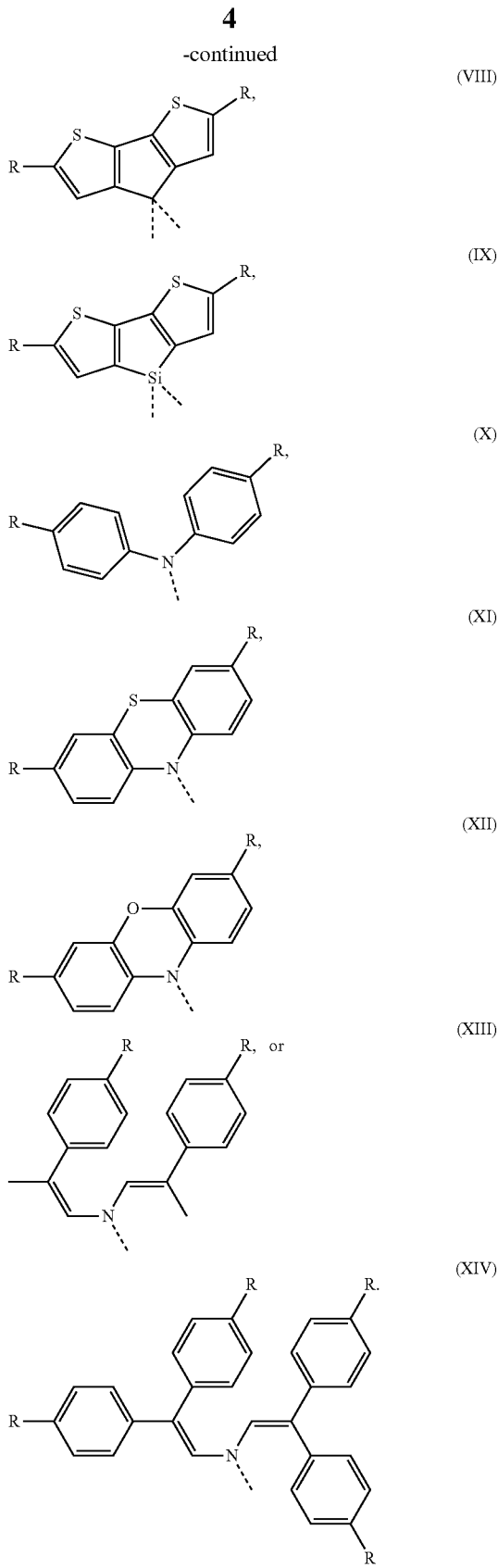

Alternatively or additionally, groups R are independently selected from the group consisting of H; $C_1$-$C_{10}$ alkyl; $C_2$-$C_{10}$ alkenyl; $C_3$-$C_{20}$ cycloalkyl; $C_3$-$C_8$ heterocycloalkyl, alkoxy, aryloxy, alkylthio, arylthio, amino, amido, ester, carboxylic acid, dialkoxy-diphenylamine, carbamate, urea, ketone, aldehyde, cyano, nitro, halogen; (cycloalkyl)alkyl and (heterocycloalkyl)alkyl.

In particular groups R are independently selected from Hydrogen

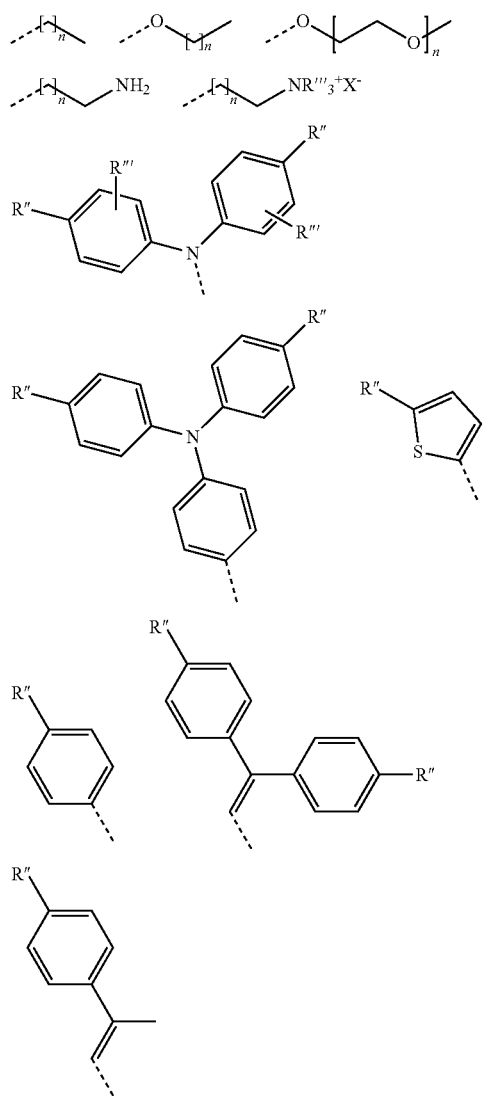

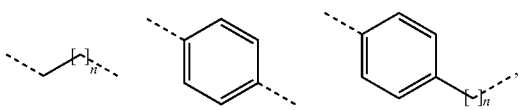

wherein
the dotted lines represent the bond by which R is connected to HTF according to formula II or III, X represents halogen (F, Cl, Br, I); R''' represents hydrogen, alkyl ($C_1$-$C_{12}$) and/or R'' represents hydrogen, alkyl, alkoxy (—$CH_3$; —$OCH_3$).

In further embodiments the linking fragment L is any one selected from $C_1$-$C_9$ alkylene, $C_4$-$C_{20}$ arylene, $C_4$-$C_{20}$ heteroarylene, $C_4$-$C_{20}$ alkylarylene, $C_4$-$C_{20}$ heteroalkylarylene heteroatoms being selected from O, N, S, Se, Si, wherein said alkylene, arylene, heteroarylene, alkylarylene, heteroalkylarylene, if they comprise three or more carbons, may be linear, branched or cyclic, especially selected from any one of wherein
the dotted lines represent the bond by which L is connected to HTF according to formula II or III.

In preferred embodiments the anchor group A (head group) is any one selected from phosphonic acid, phosphoric acid, sulfuric acid, sulfonic acid, carboxylic acid, siloxanes, especially selected from any one of

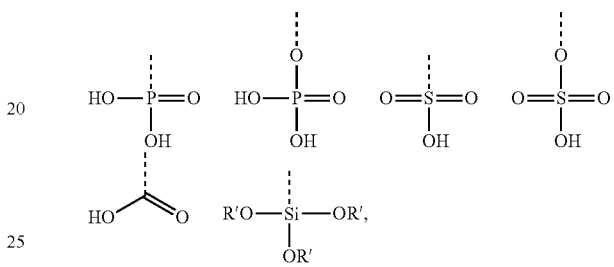

wherein the dotted lines represent the bond by which A is connected to L according to one of the preceding claims and R' is preferably aliphatic.

A further aspect of the invention is to provide a hole transporting material comprising the inventive compound.

Still a further aspect of the present invention concerns an optoelectric and/or photoelectrical device comprising the inventive compound according to one of the aforementioned embodiments.

In particular the optoelectric and/or photoelectrical device comprises a hole transmitting material, wherein the hole transmitting material comprises the compound of formula II or III.

Preferably, the optoelectronic and/or photoelectrochemical device being a photovoltaic solid state device, which is a solid state solar cell comprising an organic-inorganic perovskite as sensitizer under the form of at least one layer.

The term "perovskite", for the purpose of this specification, refers to the "perovskite structure" and not specifically to the perovskite material, $CaTiO_3$. For the purpose of this specification, "perovskite" encompasses and preferably relates to any material that has the same type of crystal structure as calcium titanium oxide and of materials in which the bivalent cation is replaced by two separate monovalent cations. The perovskite structure has the general stoichiometry $AMX_3$, where "A" and "M" are cations and "X" is an anion. The "A" and "M" cations can have a variety of charges and in the original Perovskite mineral ($CaTiO_3$), the A cation is divalent and the M cation is tetravalent. For the purpose of this invention, the perovskite formulae include structures having one (1), two (2), three (3) or four (4) cations, which may be of the same kind or different, and/or one or two (2) anions, and/or metal atoms carrying two or three positive charges, in accordance with the formulae presented elsewhere in this specification.

Further preferred, the organic-inorganic perovskite layer material of the optoelectronic and/or photoelectrochemical device comprises a perovskite-structure of any one of formulae below:

$A^1A^2A^3A^4MX_3$, $A^1A^2A^3MX_3$, $A^1A^2MX_4$; $A^1MX_3$;
$A^1A^2N_{2/3}X_4$; $A^1N_{2/3}X_3$; $BN_{2/3}X_4$; $A^1_2NMX_6$;
$BMX_4$, wherein $A^1$, $A^2$, $A^3$, $A^4$ are either organic, monovalent cations or mixtures thereof that are independently selected from primary, secondary, tertiary or quaternary organic ammonium compounds, including N-containing heterorings and ring systems, A and A' having independently from 1 to 60 carbons and 1 to 20 heteroatoms (like Methylammonium or Formamidinium), or inorganic cations (like Na, K, Rb, Cs).

B is an organic, bivalent cation selected from primary, secondary, tertiary or quaternary organic ammonium compounds having from 1 to 60 carbons and 2-20 heteroatoms and having two positively charged nitrogen atoms;

M is a divalent metal cation selected from the group consisting of $Cu^{2+}$, $Ni^{2+}$, $Co_{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$, or $Yb^{2+}$.

N is selected from the group of $Bi^{3+}$ and $Sb^{3+}$; and,

X is independently selected from $Cl^-$, $Br^-$, $I^-$, $NCS^-$, $CN^-$, and $NCO^-$. X can also be a mixture of the listed halides/anions.

In a preferred embodiment, the compound according to the invention for forming a SAM is characterized as follows. The proportion x of the formula I is x=1, from which it follows that the proportion y of the FM (filler molecule) is y=0. The anchor group A is formed from a phosphonic acid group and L is a C2. The hole-conducting fragment HTF is selected from the formula (II) (Z-D-Z) where D is N and Z is a C6-cyclic, aromatic group which is substituted by a methoxy group. Another preferred embodiment corresponds to that described above, where Z is not substituted by a methoxy group. Both embodiments have in particular in common that they can be prepared without filler molecules (FM), and this without losses in their characteristic properties and stability An additional aspect of the present invention is the use of the inventive compound as a hole transporting material in an optoelectronic and/or photoelectric device.

The method for formation of the inventive compound as a SAM on a TCO, for the use in Perovskite solar cells in inverted architecture, is given by a method comprising the steps:

First providing a substrate covered with a oxide layer, preferably TCO, which is immersed into a solution comprising a solvent and a compound according to

(I)

where L is a linking fragment, A an anchor group and HTF is a hole transporting fragment being selected from any of the following formulae II or III, a polycycle Z-D-Z (II), wherein Z and D are homocyclic or at least one of Z or D includes a heteroatom selected from the group of N, S, O, Si and Z is a C5 or C6 substituted or unsubstituted aromatic group, D is N or a C5 or C6 cyclic group, wherein two neighbored carbon atoms of cyclic group D are each bonded to one of the two aromatic groups Z and two neighbored carbon atoms of cyclic group D are each bonded to the remaining aromatic group Z to form a tricycloundecane, a tricyclotridecane or a tricyclotetradecane derivative; or

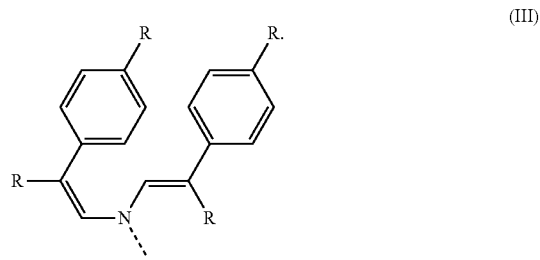

(III)

with R is a substituent, where
the FM is generally a molecule or a mixtures of molecules consisting of an anchoring group (e.g. phosphonic acid, phosphoric acid, sulfuric acid, sulfonic acid, carboxylic acid, siloxanes), which can bind to the surface of the TCO, an alkyl chain of N carbon atoms, where N=1-18, and a methyl, halogen, amino, bromide, ammonium and/or sulfuric functional group, where x is in the range of 0.02 to 1 and y=(1−x). Examples for a FM are ethyl- or butylphosphonic acid ("C2" or "C4"), or (Aminomethyl)phosphonic acid. As a solvent for the solution any liquid which is able to solve the compound and guarantees the immersion of a surface can be chosen. The concentration of the compound in the solution is preferably in the range of 0.01 to 100 mM per liter. The time for immersing the surface for the formation of the SAM should be at least sufficient for the molecules to bind to the oxide surface and is preferably in the range of 5 min to 50 hours. After immersion, the substrate is removed from the solvent. In one preferred embodiment the substrate is subsequently thermally annealed and/or washed.

In the alternative method, the compounds according to the invention, with and without FM, are centrifuged (e.g. rotated) in a solution. The optimal process for the selected HTM and possible substrates must be determined experimentally if necessary.

LIST OF FIGURES

FIG. 1 Synthesis of the phosphonic acid functionalized carbazole derivative V1036: a) 1,2-dibromoethane (6.5 ml/equiv.), tetrabutylammonium bromide (0.3 equiv.), 50% KOH aqueous solution (15 equiv.), 72 h, 60° C.; b) triethylphosphite (3.6 ml/equiv.), 18 h, 165° C.; c) 4,4'-dimethoxydiphenylamine (3 equiv.), Pd(OAc)2 (0.3 equiv.), P(t-Bu)3·BF3 (0.6 equiv.), NaOt-Bu (3 equiv.), anhydrous toluene (24.5 ml/equiv.), Ar, 5 h, reflux; d) '(10 equiv.), anhydrous dioxane (29.4 ml/equiv.), Ar, 24 h, 25° C.; e) MeOH (19.6 ml/equiv.), $H_2O$ (19.6 ml/equiv.), 15 h, r.t.

Figure 2:
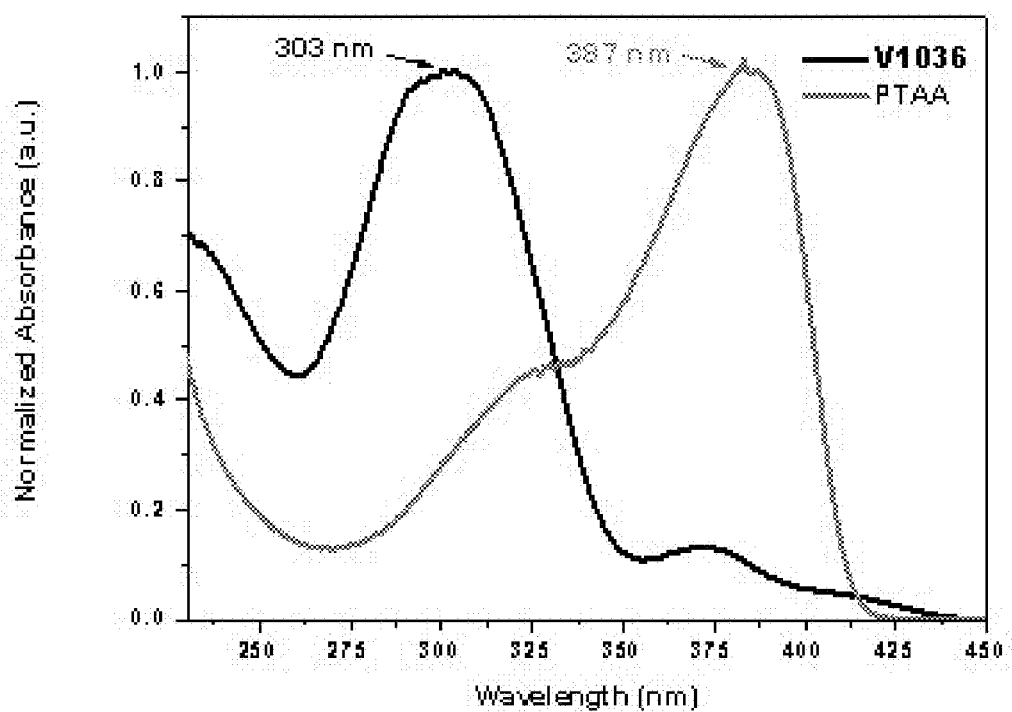
Figure 2:
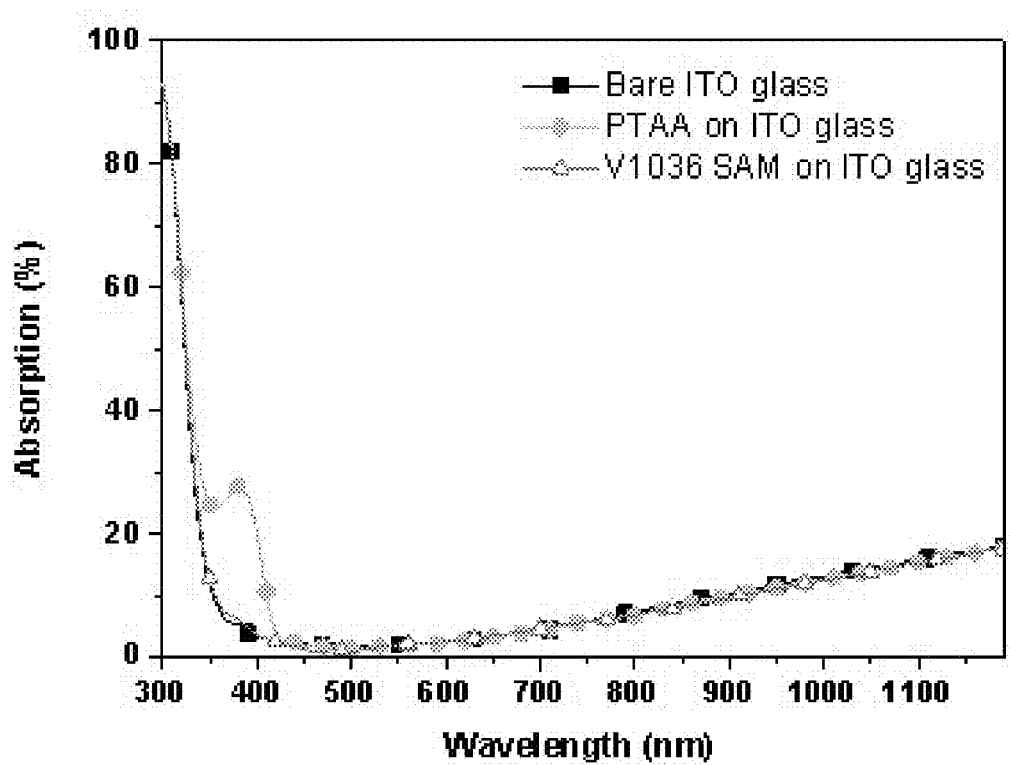

FIG. 2 A) UV/vis absorption spectra for $10^{-4}$ M tetrahydrofuran (THF) solution of V1036 (—) and PTAA (Poly (triaryl ammin))(----); B) UV/vis absorption spectra of the bare ITO substrate (●), ITO with PTAA (■), and ITO with 100% V1036 SAM (△).

Figure 3:
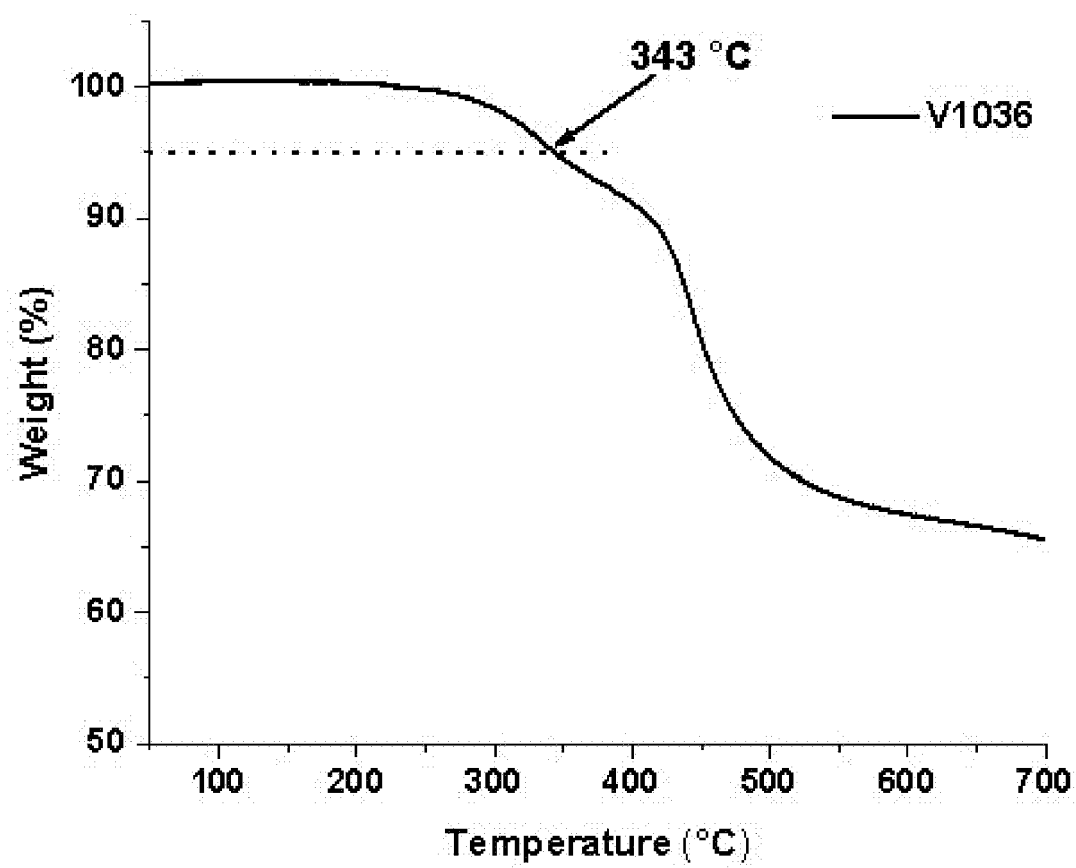

FIG. 3 TGA heating curve of V1036. Heating rate 10° C. min-1.

Figure 4:
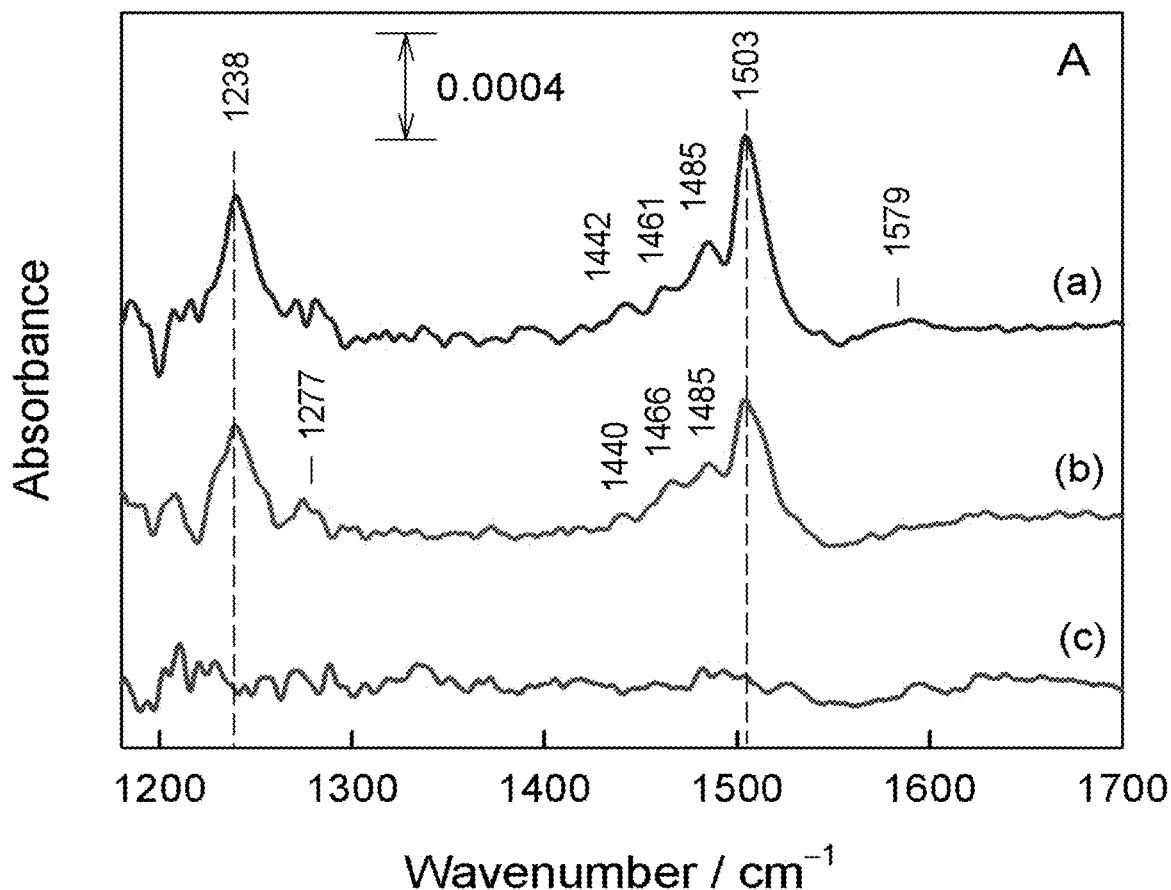
Figure 4:
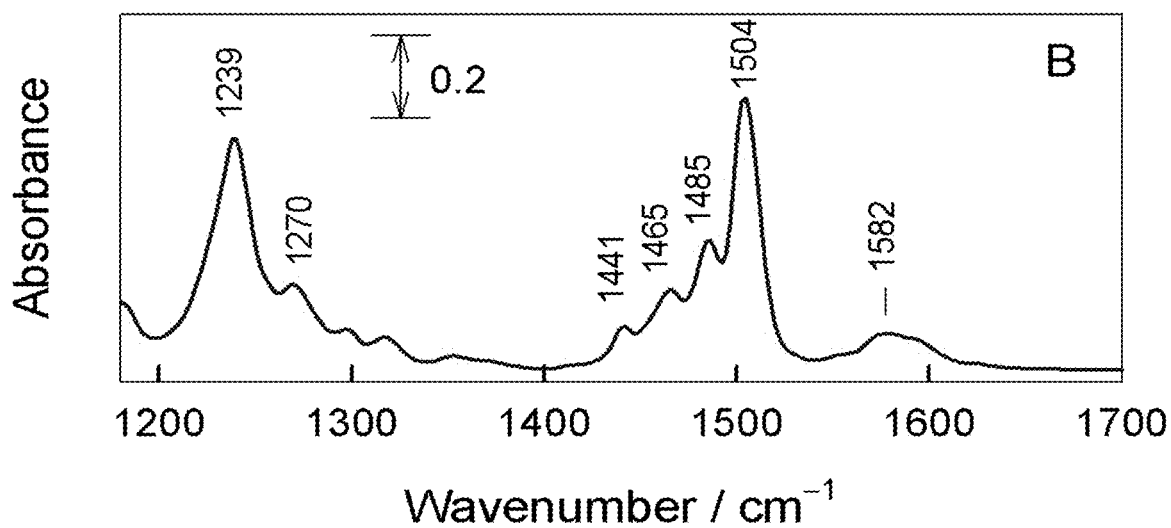

FIG. 4. A) FTIR absorbance spectra of monolayers on Si/ITO substrate prepared from (a) 1 mM solution of V1036, (b) 1 mM of mixed solution V1036:C4 (1:9), and (c) 1 mM solution of C4. B) FTIR spectrum of bulk V1036 in KBr tablet.

Figure 5:
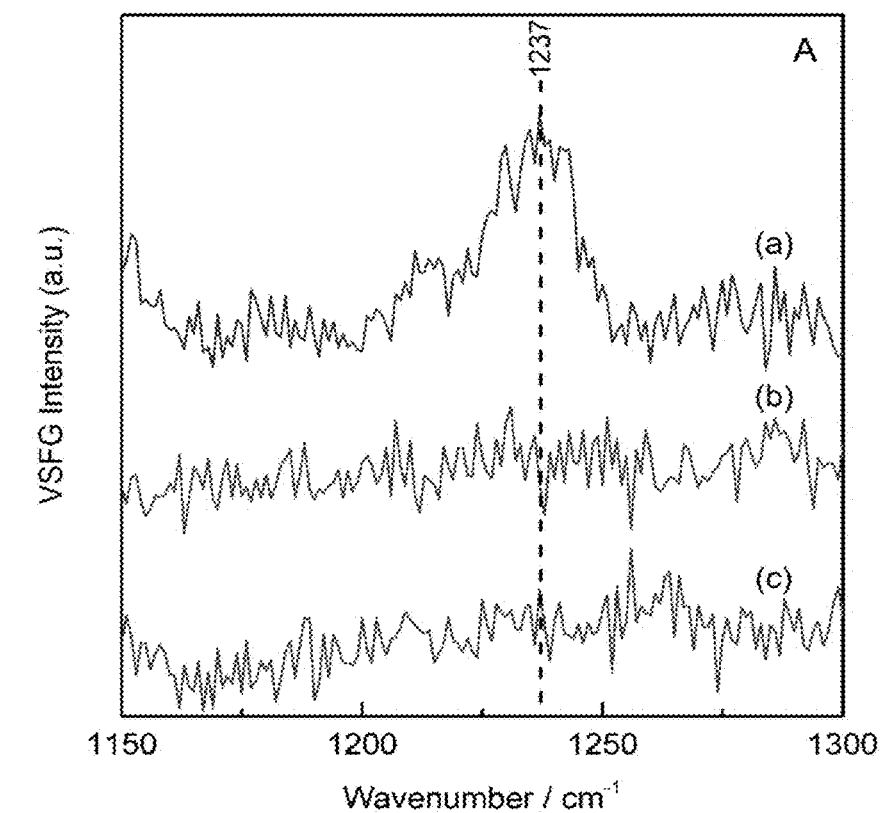
Figure 5:
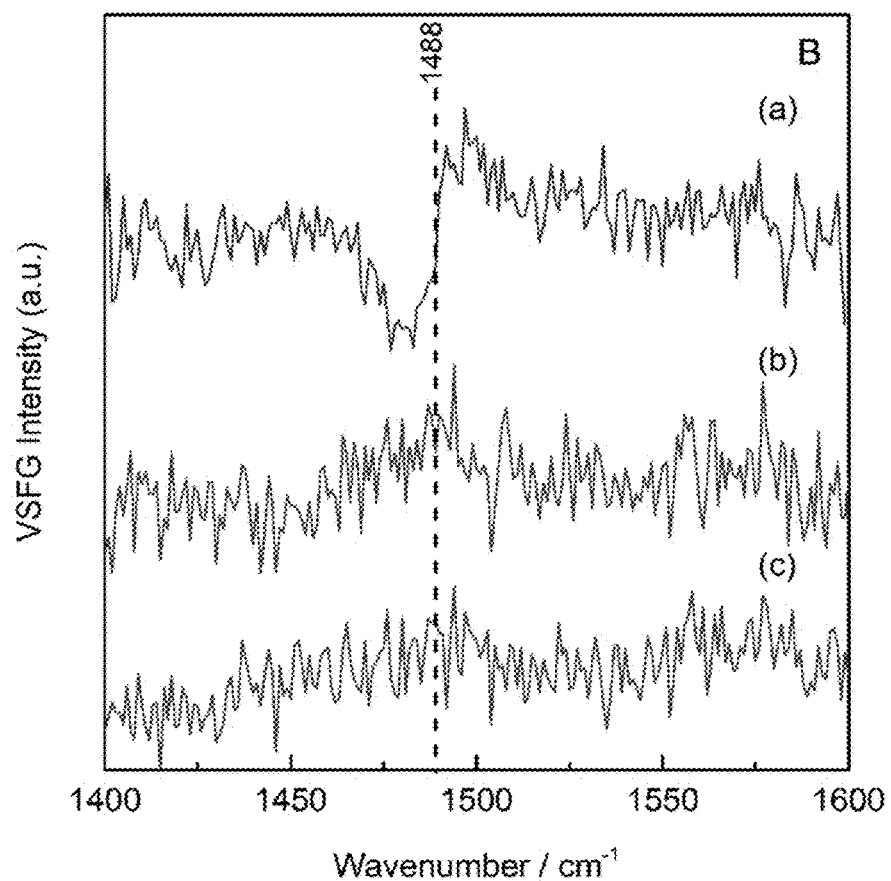

FIG. 5. A) VSFG spectra of monolayers on Si/ITO substrate prepared from (a) 1 mM solution of V1036, (b) 1 mM of mixed solution V1036:C4 (1:9), and (c) 1 mM solution of C4 in the spectral region 1150-1300 cm−1 and B) in the spectral region 1400-1600 cm1.

Figure 6:
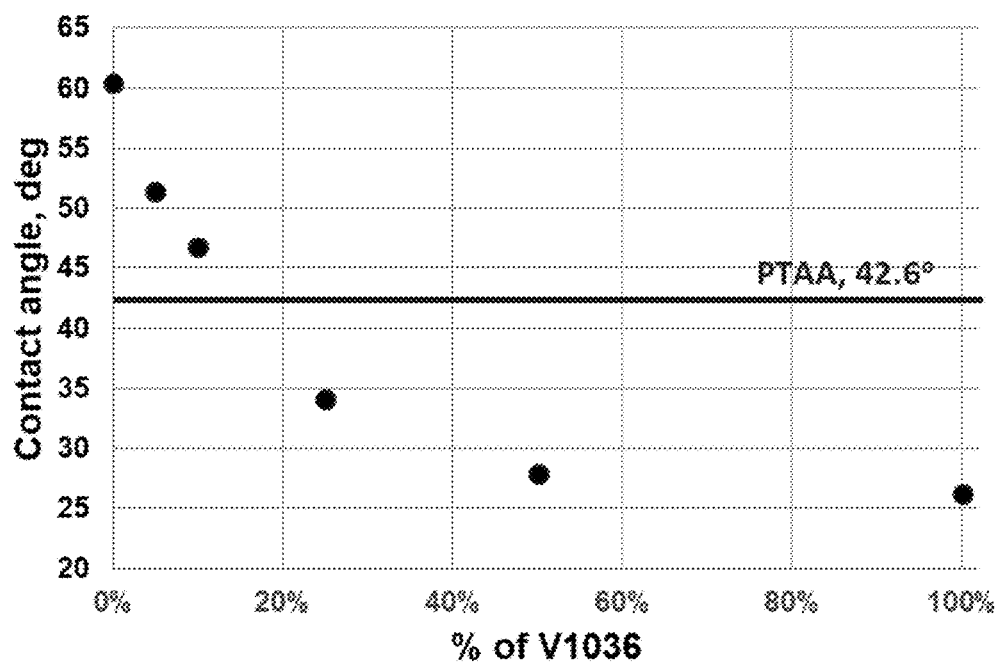
Figure 6:
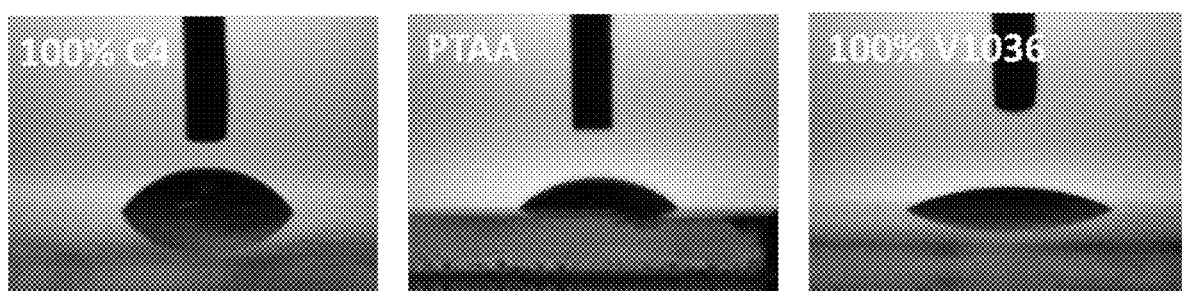

FIG. 6. A) Contact angle dependence on the percentage of the V1036 in the SAM composition; B) Equilibrium contact angle of perovskite solution on 100% C4 SAM; PTAA; 100% V1036 SAM.

Figure 7:
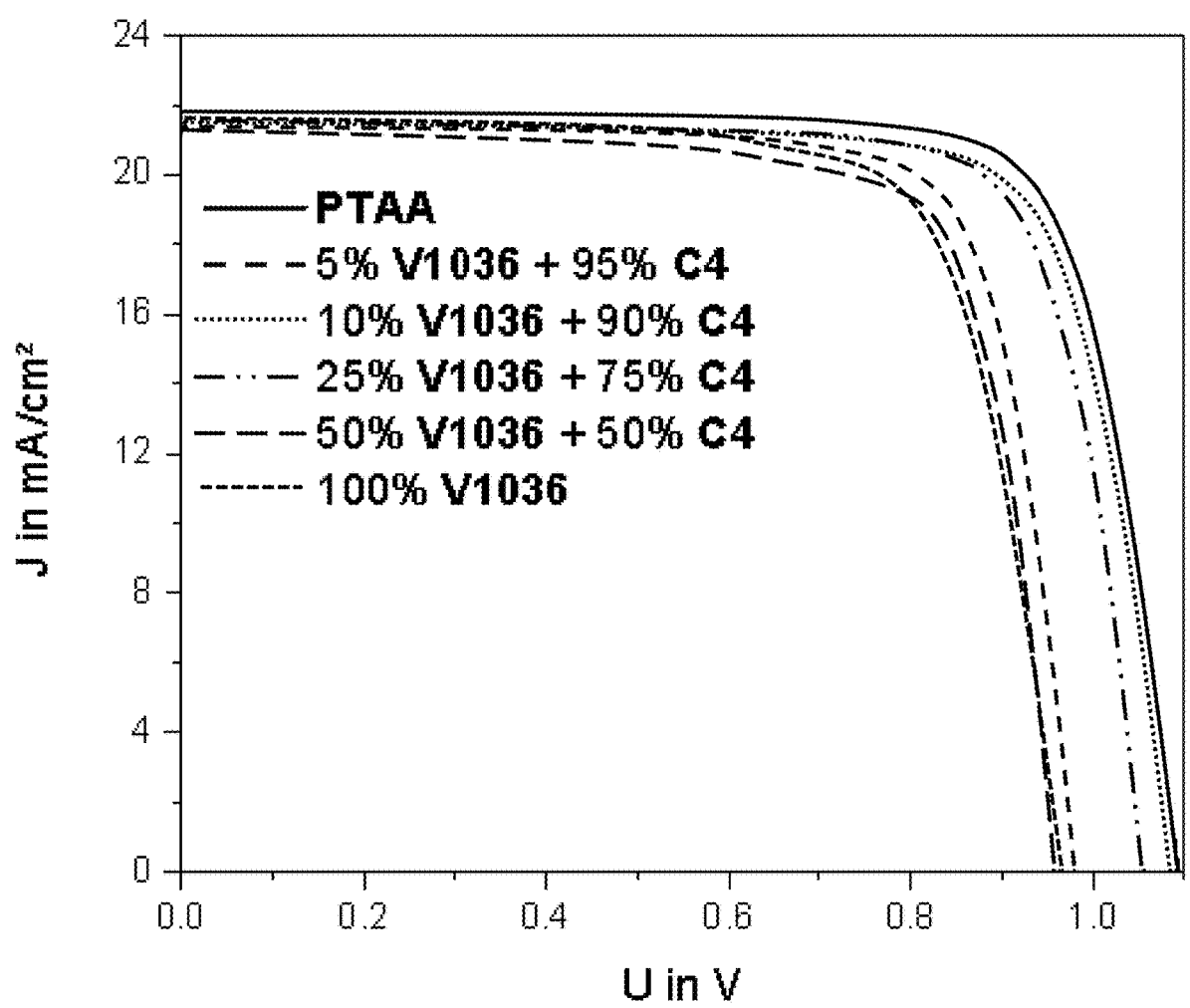

FIG. 7 J-V characteristics of the best performing PSCs with PTAA and SAM HTMs.

Figure 8:
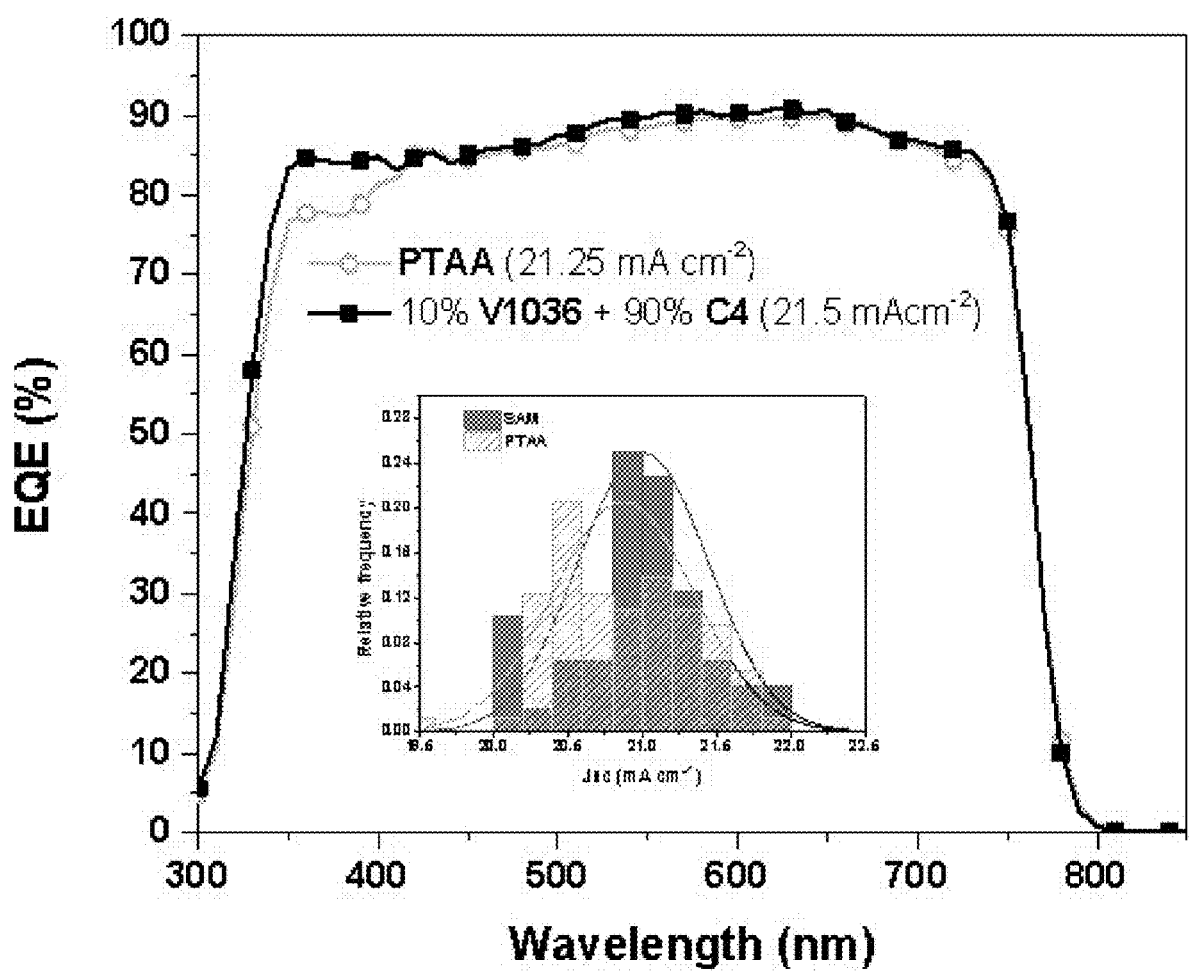

FIG. 8. A: J-V characteristics from forward scan and reverse scan of the best performing PSC with PTAA (○) and 10% V1036 90% C4 SAM HTMs (■). B: EQE and integrated Jsc of the best-performing PSC with PTAA (---, horizontal pattern) and 10% V1036 90% C4 SAM-HTMs (—, vertical pattern). The inset shows statistical distribution of the Jsc.

Figure 9:
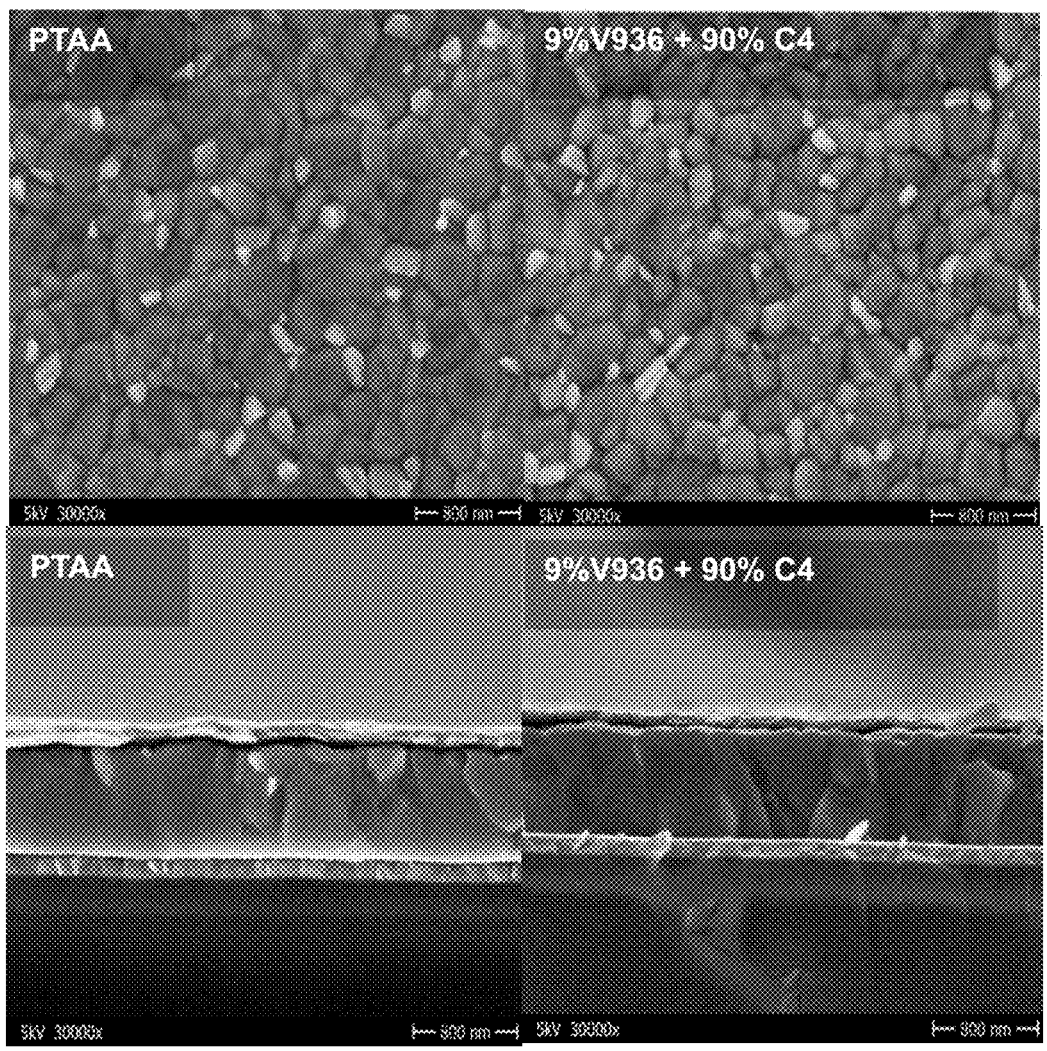

FIG. 9. SEMs of PTAA and 10% V1036 90% C4, top and cross section.

Figure 10:
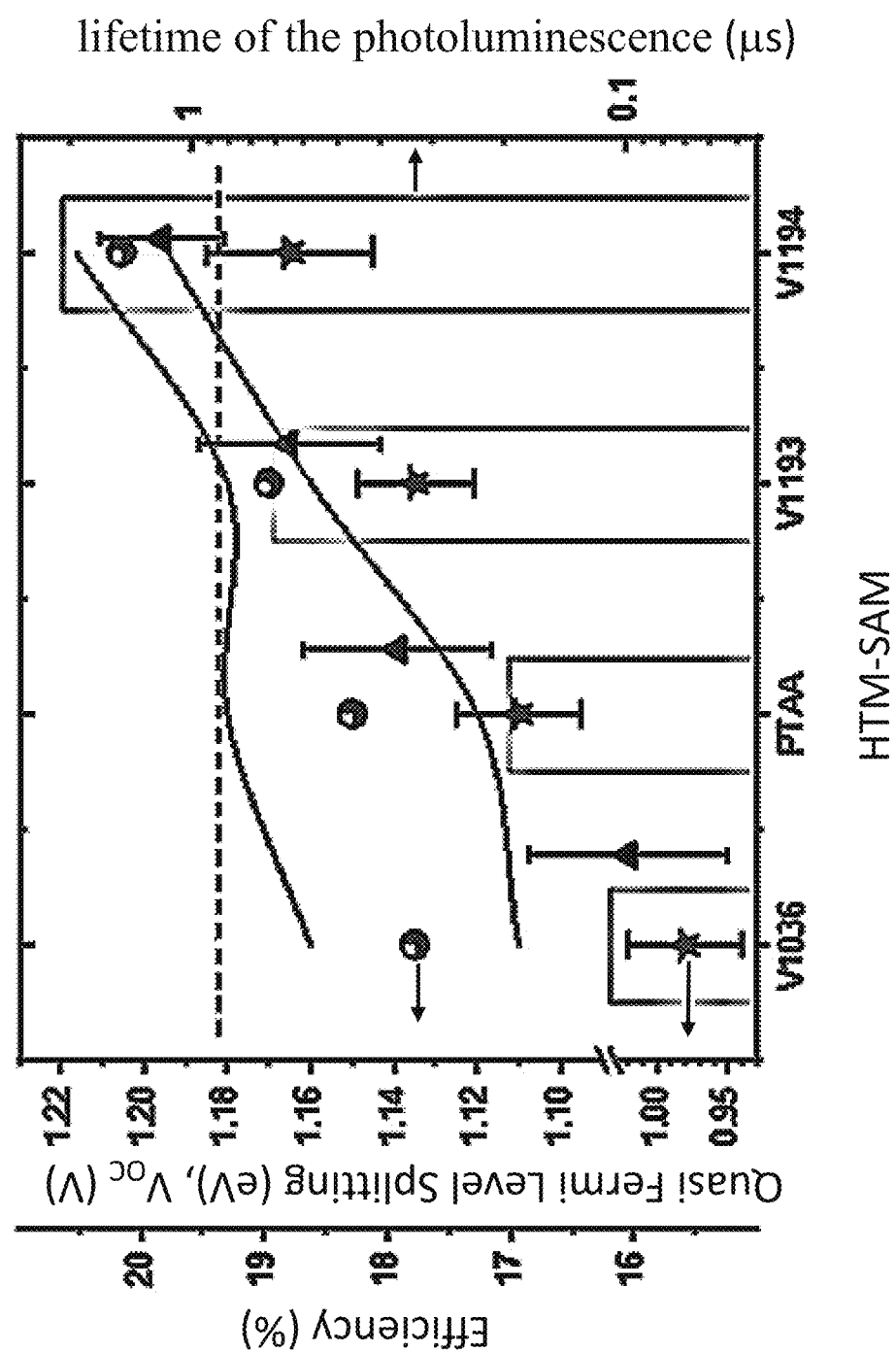

FIG. 10: Comparison of parameters of "triple cation" perovskite absorber (Cs5 (MA17FA83Pb (I83Br17) 3) 95) applied to various HTM-SAMs, V1036, PTAA, V1193 and V1194.

EXAMPLES

Dimethoxy-diphenylamine substituted carbazole, functionalized with phosphonic acid (V1036), was synthesized. Dimethoxydiphenylamine substituted carbazole fragment can be found in several efficient HTMs for regular perovskite solar cells, and active hydrogen in the 9-th position of carbazole can be further used for the functionalization with phosphonic acid anchor groups (head-group).

Synthesis was done in a 4-step synthetic procedure (see FIG. 1), starting from commercially available materials. In the first step 3,6-dibromocarbazole was alkylated by 1,2-dibromoethane to give intermediate compound 1. In the next step, by means of the Arbuzov reaction aliphatic bromide was transformed into phosphonic acid ethyl ester 2. Further on, by means of the palladium-catalyzed Buchwald-Hartwig amination reaction, dimethoxydiphenylamine fragments were introduced to give compound 3. Finally, phosphonic acid V1036 was obtained by means of cleavage of the ester with bromotrimethylsilane. Structures of the synthesized compounds were confirmed by means of $^1$H and $^{13}$C NMR spectroscopy. A more detailed description of the synthetic procedures is given below.

In the inverted PSC light first passes through the HTM layer, thus it is important to minimize parasitic absorption of this layer. Optical properties of V1036 (—) were investigated by means of UV/vis spectroscopy from $10^{-4}$ M THF (tetrahydrofuran) solution (FIG. 2A). Strong π-π* absorption band, with $\lambda_{max}$=304 nm, as well as weaker n-π* band in the 350-450 nm region, which is characteristic for the dimethoxydiphenylamine 3,6-substituted carbazole chromophoric system, can be observed. In comparison to PTAA, V1036 has broader absorption, yet due to the fact that thickness of the monolayer is much smaller, it has negligible absorption, when formed on top of the ITO (FIG. 2B).

As can be seen from FIG. 3, the bulk V1036 material, without FM, has a 95% weight loss temperature ($T_{dec}$) of 343° C., which is suitable for the practical applications in optoelectronic devices.

To confirm a SAM formation on the ITO surface, FTIR (Fourier-transform infrared spectroscopy) spectra of self-assembled monolayers on Si/ITO substrates were recorded (FIG. 4A) and compared to the spectrum of bulk V1036 compound dispersed in KBr tablet (FIG. 4B). The spectrum of SAM, prepared from 1 mM V1036 solution in methanol (100% V1036), exhibits two intense bands at 1238 and 1503 $cm^{-1}$ along with lower intensity components near 1442, 1461, and 1485 $cm^{-1}$ (FIG. 4A, (a)) In FIG. 4A (b) the spectra of 1 mM of mixed solution V1036:C4 (1:9) and in (c) the spectra of 1 mM solution of C4 are given for comparison. All observed features in the monolayer spectrum are close to the absorption bands visible in the infrared spectrum from bulk V1036 compound, confirming presence of the V1036 on the surface of the ITO substrate. The most intense band at 1503 $cm^{-1}$ is associated with C=C in-plane stretching vibration of aromatic rings of the carbazole structure with some contribution from C=C in-plane stretching vibration of p-methoxy-phenyl groups. Stretching vibrations of C—N bonds are visible as an intense band near 1238 $cm^{-1}$. Two middle intensity bands located in the vicinity of 1438-1442 and 1461-1466 $cm^{-1}$ contain high contribution from symmetric and asymmetric $CH_3$ deformation vibrations of the methoxy group. The integrated absorbance intensity of the band near 1503 $cm^{-1}$ was found to decrease for the SAM, prepared from methanolic solution, containing 0.1 mM V1036 and 0.9 mM C4 as the FM (10% V1036 90% C4), down to 0.62 of the relative intensity, which indicates a decrease in surface coverage by the V1036 compound compared to the 100% V1036 SAM (relative intensity 1.00). Clearly, the decrease in surface coverage for the V1036 compound is not as high as could be expected from the composition of adsorption solution, indicating a higher surface affinity for V1036 compared to C4.

In FIG. 5 we present Vibrational sum-frequency generation (VSFG) spectra of HTM SAMs (V1036 with and without filler molecule) on Si/ITO substrate in the spectral region 1150-1300 $cm^{-1}$ (A) and in the spectral region 1400-1600 $cm^{-1}$ (B). Two peaks at ~1237 $cm^{-1}$ (FIG. 5A, (a)) and ~1490 $cm^{-1}$ (FIG. 5B, (a)) were identified in the spectra of 100% V1036 SAM.

Those two bands correspond to the two most intense vibrational bands seen in the FTIR spectra of the same monolayer (FIG. 5A, (a)). The Si/ITO substrate yields a substantial non-resonant SFG signal, which interferes with the resonant signal and leads to the spectral distortions as can be seen from Eq. S1. Due to this interference, the shape of the resonance centered at ~1490 $cm^{-1}$ resembles the asymmetric Fano-like resonance and also appears to be shifted in frequency compared to the FTIR spectra (~1503 $cm^{-1}$).

No vibrational bands were identified in the spectrum of a 10% V1036 90% C4 SAM. An expected VSFG intensity should be ~100 times smaller than the intensity of a 100% V1036 SAM. In such a case, the VSFG signal would be below the detection limit. However, FTIR spectra showed that surface coverage by V1036 in the mixed SAM corresponds to ~0.62 surface coverage of a pure V1036 SAM. VSFG signal of a monolayer with such surface coverage should be still detectable; however, no signal was registered. The measured VSFG signal is proportional to the asymmetry in the orientation of the probed molecules and therefore it gives a unique information about molecular ordering at the surface. This indicates that a monolayer prepared from a mixed solution results in a more disordered structure compared to a monolayer from a pure V1036 solution.

First, to study influence of the SAM on surface energy, as well as influence of the change of the ratio in mixed SAMs, contact angle measurements were performed, using triple-cation perovskite solution as a probing liquid. As it can be seen from FIG. 6/Table 1, for PTAA, 100% V1036 SAM, and 100% C4 SAM contact angles of 42.6°, 26.3°, and 60.5° respectively. For the mixed SAMs contact angle gradually changes, confirming presence of the both species on the surface of the ITO. Differences in contact angles correlate with the polarity of the material, giving larger angle values for non-polar aliphatic 100% C4 SAM, and lowest value for 100% V1036 SAM with methoxy functional groups.

TABLE 1

Values of the equilibrium contact angles for various substrates.

| Substrate | Contact angle, degrees |
|---|---|
| PTAA | 42.59 |
| ITO | 50.02 |
| 100% C4 | 60.47 |
| 5% V1036 + 95% C4 | 51.43 |
| 10% V1036 + 90% C4 | 46.75 |
| 25% V1036 + 75% C4 | 34.1 |
| 50% V1036 + 50% C4 | 27.84 |
| 100% V1036 | 26.28 |

Good matching of the energy levels is one of the important requirement for the efficient device operation. To investigate influence of the SAMs on the energy levels of ITO substrates, as well as to study bulk properties of V1036, ionization potential ($I_p$) was measured by means of photo-electron spectroscopy in air (PESA) (Table 2).

For PTAA film, spin-coated from 2 mg/ml toluene on ITO, 5.18 eV Ip value was obtained, which is close to the previously reported value of 5.16 eV[10]. Bulk V1036 showed Ip of 5.04 eV, which is characteristic value for this chromophore. For the 100% V1036 SAM, formed on ITO 4.98 eV value was obtained, which is in a good agreement with the bulk material value. Mixed SAM, with 10% V1036 90% C4 composition showed 5.09 eV. It can be assumed, that mixed SAM gives slightly higher Ip, yet the change is within the range of 0.1 eV, thus it should not strongly affect device performance.

TABLE 2

$I_p$ values ($W_f$ for ITO) of the investigated materials.

| Material | V1036 | 100% V1036 SAM | 10% V1036 90% C4 SAM | PTAA | ITO |
|---|---|---|---|---|---|
| $I_p$ ($W_f$ for ITO), eV | 5.04 | 4.98 | 5.09 | 5.18 | 4.6[11] |

To study if formed SAMs can act as a HTM, p-i-n PSC devices of the ITO/HTM/Perovskite/$C_{60}$/BCP/Cu (BCP: bathocuproin) architecture were constructed. Triple-cation perovskite was used for all devices, and thin layer of dopant-free PTAA was used as a control HTM.

First, impact of the ratio between V1036 and butylphosphonic acid (C4) on devices performances was studied. As can be seen form FIG. 7, the best result of 17.8% PCE was obtained for SAM with 10% of V1036. Control device with PTAA showed a bit higher efficiency of 18.4% PCE.

To have a better insight in a variation of different parameters, statistical data is presented in Table 3 As can be seen, Jsc vary only negligibly and on average is very close, or even slightly better for SAM HTMs than of PTAA. It can be explained by the lower parasitic absorption by SAM HTM layers. Average FF for SAMs is a bit lower than that of PTAA (76.3%), reaching maximum of 71.2% for 25% V1036 75% C4 SAM, yet the best achieved values are very close to that of the PTAA. With the higher amounts of V1036 reduction of Voc is observed, possibly due to the direct contact of the perovskite with ITO. This assumption is supported by the fact that HTM-free devices with bare ITO gave very low performance, mainly due to the strongly reduced Voc.

TABLE 3

Average PSCs performance parameters, extracted from the J/V scans, including the standard errors and performance parameters of the best devices (in brackets). The statistics is based on 9-20 cells on different substrates for different HTMs.

| HTM | Jsc, mA·cm$^{-2}$ | Voc, V | FF, % | PCE, % |
|---|---|---|---|---|
| PTAA | 21.100 ± 0.080 (21.656) | 1.084 ± 0.002 (1.093) | 76.301 ± 0.193 (77.633) | 17.455 ± 0.099 (18.372) |
| 5% V1036 95% C4 | 21.077 ± 0.268 (21.257) | 0.945 ± 0.064 (0.980) | 65.795 ± 2.113 (77.117) | 13.051 ± 0.904 (16.071) |
| 10% V1036 90% C4 | 21.186 ± 0.103 (21.413) | 1.046 ± 0.012 (1.085) | 70.874 ± 1.755 (76.485) | 15.778 ± 0.548 (17.765) |
| 25% V1036 75% C4 | 21.269 ± 0.186 (21.743) | 1.017 ± 0.007 (1.055) | 71.223 ± 1.560 (76.110) | 15.432 ± 0.481 (17.454) |
| 50% V1036 50% C4 | 20.905 ± 0.080 (21.161) | 0.942 ± 0.014 (0.958) | 67.169 ± 2.204 (76.004) | 13.239 ± 0.512 (15.400) |
| 100% V1036 | 21.221 ± 0.277 (21.773) | 0.930 ± 0.033 (0.964) | 66.482 ± 2.115 (72.805) | 13.163 ± 0.826 (15.289) |

It is known that for the p-i-n PSCs only negligible hysteresis is observed. In the case of SAM HTM, the best device with 10% V1036 90% C4 SAM showed only slightly stronger hysteresis in comparison to control device with PTAA (FIG. 8A).

Next, to study influence of the length of the aliphatic phosphonic acid as filler molecule on the overall device performance, ethylphosphonic (C2), and n-hexylphosphonic (C6) acids were tested. It was hardly possible to form a perovskite film on 10% V1036 90% $C_6$ SAM due to bad wetting. Devices with $C_2$ filler gave slightly lower performance, due to the reduced Voc and Jsc. Thus C4 is one of the preferred length of the filler molecule in combination with V1036.

To further study properties of the best devices, external quantum efficiency (EQE) measurements were performed. From the FIG. 8B it can be seen that small gain in current can be obtained due to the very small thickness of the SAM. It can be attributed to the reduced absorption from the HTM, as was previously demonstrated by UV/vis absorption measurements (FIG. 2). Jsc values, obtained by integration of the EQE data are in a close agreement with Jsc obtained from J/V scan.

To see if SAM gives difference in perovskite morphology, SEM (scanning electron microscopy) study was performed. As can be seen from the SEM (FIG. 9) top and cross-section pictures, SAM does not introduce a lot of changes in morphology of the perovskite, and the grains are similar to that of the control device.

Additional information on synthesis and characterization methods

Chemicals were purchased from Sigma-Aldrich and TCI Europe and used as received without further purification. The $^1$H and $^{13}$C NMR spectra were taken on Bruker Avance III (400 MHz) spectrometer at room temperature. All the data are given as chemical shifts in δ (ppm). The course of the reactions products was monitored by thin layer chromatography (TLC) on ALUGRAM SIL G/UV254 plates and developed with UV light. Silica gel (grade 9385, 230-400 mesh, 60 Å, Aldrich) was used for column chromatography. Elemental analysis was performed with an Exeter Analytical CE-440 elemental analyser, Model 440 C/H/N/. Thermogravimetric analysis (TGA) was performed on a Q50 thermogravimetric analyser (TA Instruments) at a scan rate of 10 K min$^{-1}$ in the nitrogen atmosphere. Electrothermal MEL-TEMP capillary melting point apparatus was used for determination of melting points. UV/vis spectra were recorded on Shimadzu UV-3600 spectrometer.

Contact angle measurement was performed by Kruss, Drop Shape Analysis System DSA25.

For the FTIR and VSFG measurements ITO on Si substrate was deposited and was further functionalized with SAMs according to above mentioned procedure.

FTIR spectra of monolayers were recorded in transmission mode by using FTIR spectrometer Vertex 80v (Bruker, Inc., Germany), equipped with a liquid-nitrogen cooled mercury cadmium telluride (MCT) narrow band detector. Spectra were acquired from 512 interferogram scans with 4 cm$^{-1}$ resolution; final spectrum was obtained by averaging two spectra. Blank Si substrate with 30 nm thick ITO layer was used as a reference sample. The sample chamber and the spectrometer were evacuated during the measurements. Spectra were corrected by polynomial function background subtraction. No smoothing procedures were applied to the experimental data. Parameters of the bands were determined by fitting the experimental contour to Gaussian-Lorentzian shape components using GRAMS/AI 8.0 (Thermo Electron Corp.) software.

Infrared spectrum of bulk V1036 sample was recorded in transmission mode on an ALPHA FTIR spectrometer (Bruker, Inc., Germany), equipped with a room temperature detector DLATGS. The spectral resolution was set at 4 cm$^{-1}$. Spectrum was acquired from 124 interferogram scans. Sample was dispersed in KBr tablet.

VSFG spectra were recorded using commercially available VSFG system from Ekspla PL2143A20. Nd:YAG laser generates pulses at 1064 nm with a pulse length ~28 ps and 20 kHz repetition rate. Part of the laser output is used to pump optical parametric generator (EKSPLA PG401VIR/DFG) to produce infrared pulses ($\omega_{IR}$), which can be tuned in the range between 1000 cm$^{-1}$ and 4000 cm$^{-1}$ with the typical energies 60-200 µJ, respectively. The second harmonic of the laser output (532 nm) is used as a visible beam ($\omega_{VIS}$) for sum-frequency generation ($\omega_{SF}$). Sum-frequency is generated when infrared and visible pulses overlap in time and space on the sample surface. All spectra in this work were recorded with a polarization combination ssp (s—SFG, s—VIS, p—IR). The intensity of the visible beam was attenuated to avoid damage of the samples (~30 µJ). The generated sum-frequency light is filtered with a monochromator and detected with a photomultiplier tube (PMT).

The measured VSFG intensity is proportional to $$I_{VSFG} \propto \left| A_{NR} e^{i\phi} + \sum_q \frac{A_{Rq}}{\omega_{IR} - \omega_q + i\Gamma_q} \right|^2 \quad (S1)$$

where $A_{NR}$ is the non-resonant amplitude, $A_{Rq}$ is the resonant amplitude of the q-th vibration, $\phi$ is the phase between resonant and non-resonant contributions. $\omega_q$ and $\delta_q$ are frequency and width of q-th vibration, respectively.

The solid state ionization potential ($I_p$) of the V1036, PTAA on ITO, and SAM-HTMs on ITO was measured by the electron photoemission in air method[14–16]. The sample for the ionization potential measurement of bulk V1036 was prepared by dissolving material in THF and was coated on Al plate pre-coated with ~0.5 µm thick methylmethacrylate and methacrylic acid copolymer adhesive layer. The thickness of the layer was ~0.5-1 µm. PTAA layer on ITO was formed by spin-coating, in a similar manner to the rocedure used for the PSC formation. SAM-HTMs were formed by above mentioned procedure.

Usually photoemission experiments are carried out in vacuum and high vacuum is one of the main requirements for these measurements. If vacuum is not high enough the sample surface oxidation and gas adsorption are influencing the measurement results. In our case, however, the organic materials investigated are stable enough to oxygen and the measurements may be carried out in the air. The samples were illuminated with monochromatic light from the quartz monochromator with deuterium lamp. The power of the incident light beam was $(2-5) \cdot 10^{-8}$ W.

The negative voltage of −300 V was supplied to the sample substrate. The counter-electrode with the 4.5×15 mm$^2$ slit for illumination was placed at 8 mm distance from the sample surface. The counter-electrode was connected to the input of the BK2-16 type electrometer, working in the open input regime, for the photocurrent measurement. The $10^{-15}$-$10^{-12}$ A strong photocurrent was flowing in the circuit under illumination. The photocurrent I is strongly dependent on the incident light photon energy hv. The $I^{0.5}$f(hv) dependence was plotted. Usually the dependence of the photocurrent on incident light quanta energy is well described by linear relationship between $I^{0.5}$ and hv near the threshold. The linear part of this dependence was extrapolated to the hv axis and $I_p$ value was determined as the photon energy at the interception point.

Laser-patterned indium tin oxide (ITO) glass substrates (25×25 mm, 15 Ω sq−1, pattern from Automatic Research GmbH) were cleaned sequentially for 15 min with Mucasol 2% solution, DI-water, acetone, and isopropanol in an ultrasonic bath. After that the samples were dried with a nitrogen gun and directly before HTM deposition, substrates were treated in an UV ozone cleaner (FHR Anlagenbau) for 15 min.

All subsequent procedures were done in a nitrogen-filled glovebox.

The HTM SAMs were processed by immersing UV-ozone treated ITO substrates into a 1 mM/l solution of the corresponding phosphonic acid molecules, dissolved in isopropanol, for 20 h, followed by annealing at 100° C. for 1 h and subsequent washing with isopropanol and chlorobenzene. To improve the quality of the monolayer and study the impact on solar cell device performance, mixtures of V1036 and n-butylphosphonic acid (C4) with different ratios were studied in addition to the pure V1036 SAM.

For the PTAA control devices, PTAA (Sigma Aldrich) was spin-coated from a 2 mg ml$^{-1}$ solution in anhydrous toluene at 4000 rpm (5 s acceleration) for 30 s and annealed on a hot plate at 100° C. for 10 min.

Triple-cation $Cs_{0.05}(MA_{0.17}FA_{0.83})_{0.95}Pb(I_{0.83}Br_{0.17})_3$ perovskite film was formed according to a slightly modified previously reported procedure. First, $PbBr_2$ and $PbI_2$ were dissolved in DMF:DMSO (4:1 volume ratio of Dimethyl formamide and Dimethyl sulfoxide), to the nominal concentration of 1.5 M, by shaking overnight at 60° C. Next, the $PbBr_2$ and $PbI_2$ stock solutions were added to MABr (methylammoniumbromide) and FAI (formamidinium-FA-iodide) powders respectively, to obtain $MAPbBr_3$ and $FAPbI_3$ solutions with a final concentration of 1.24 M. The molar ratio between lead and the respective cations was 1.09:1.00 (9% lead excess) for both solutions. $MAPbBr_3$ and $FAPbI_3$ solutions were then mixed in a 1:5 volume ratio. Finally, the Cesium cation was added from a 1.5 M CsI solution in DMSO in a 5:95 volume ratio. This final Perovskite solution was slightly diluted by adding DMF:DMSO (4:1) in a 5:95 volume ratio for substrates with suboptimal wettability properties.

The precursor solution is deposited on top of the HTM layer by spin-coating using the following program: 4000 rpm (5 s acceleration) for 35 s (total time–40 s).

After 25 s, 500 μl of Ethyl Acetate was poured on the spinning substrate. After the spin-coating program, the perovskite-coated sample is annealed at 100° C. for 60 min on a hotplate.

On top of the perovskite, 23 nm of C60 and 8 nm of BCP were deposited by thermal evaporation (Mbraun ProVap 3G) with evaporation rates of ca. 0.1-0.3 Å/s at a base presurre of under 1E-6 mbar. Finally, 80-100 nm of Cu was evaporated at a rate of 0.3-1 Å/s to complete the device structure. The active area is defined by the overlap of ITO and the metal electrode, which is 0.16 cm².

Routes for Synthesis:

For V1036

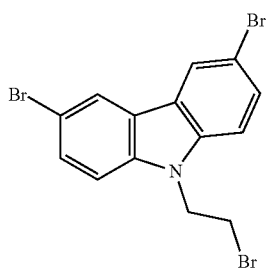 [SMILES: BrCCn1c2ccc(Br)cc2c2cc(Br)ccc21]

3,6-dibromo-9-(2-bromoethyl)-9H-carbazole (1)

Starting compound 3,6-dibromocarbazole (2 g, 6.15 mmol) was dissolved in 1,2-dibromoethane (40 ml), and tetrabuthylammonium bromide (0.198 g, 0.62 mmol) with 50% KOH aqueous solution (1.72 ml, 30.77 mmol) were added subsequently. Reaction was stirred at 60° C. for three days (TLC, acetone:n-hexane, 1:24, v:v) after each 24 h adding 0.198 g of tetrabuthylammonium bromide and 1.72 ml of 50% aqueous KOH solution. After completion of the reaction, extraction was done with dichloromethane. The organic layer was dried over anhydrous $Na_2SO_4$ and the solvent was distilled off under reduced pressure. The crude product was purified by column chromatography using acetone:n-hexane, 3:22, v:v as eluent to give 2.4 g (90%) of white crystalline material ($T_m$=153-155° C.)—compound 1

Anal. calculated for $C_{14}H_{10}NBr_3$, %: C, 38.93; H, 2.33; N, 3.24; found, %: C, 38.78; H, 2.42; N, 3.11.

$^1$H NMR (400 MHz, $CDCl_3$) δ 8.07 (d, J=1.8 Hz, 2H); 7.54 (dd, J=8.7, 1.9 Hz, 2H), 7.25 (d, J=8.7 Hz, 2H); 4.59 (t, J=7.2 Hz, 2H); 3.62 (t, J=7.2 Hz, 2H).

$^{13}$C NMR (100 MHz, $CDCl_3$) δ 138.83; 129.28; 123.65; 123.38; 112.71; 110.16; 44.75; 27.94.

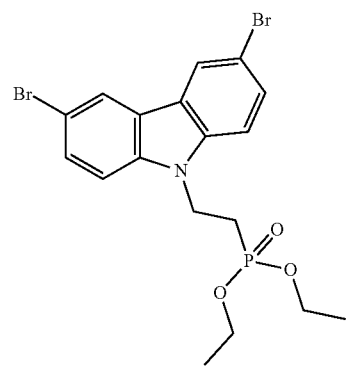 [SMILES: CCOP(=O)(CCn1c2ccc(Br)cc2c2cc(Br)ccc21)OCC]

diethyl [2-(3,6-dibromo-9H-carbazol-9-yl)ethyl] phosphonate (2)

Compound 1 (2.4 g, 5.55 mmol) was dissolved in triethylphosphite (20 ml) and the reaction mixture was heated at reflux for 18 h. After reaction completion (TLC, acetone:n-hexane, 2:3, v:v) the solvent was distilled off under reduced pressure. The crude product was purified by column chromatography using acetone:n-hexane, 7:18, v:v as eluent to give 2.56 g (95%) of white crystalline material ($T_m$=118-119° C.)—compound 2

Anal. calculated for $C_{18}H_{20}NBr_2O_3P$, %: C, 44.20; H, 4.12; N, 2.86; found, %: C, 44.09; H, 4.26; N, 3.02.

$^1$H NMR (400 MHz, $CDCl_3$) δ 8.11 (d, J=1.8 Hz, 2H); 7.56 (dd, J=8.7, 1.9 Hz, 2H); 7.30 (d, J=8.7 Hz, 2H); 4.60-4.49 (m, 2H); 4.04 (dq, J=14.2, 7.1 Hz, 4H); 2.28-2.16 (m, 2H); 1.24 (t, J=7.1 Hz, 6H).

$^{13}$C NMR (100 MHz, $CDCl_3$) δ 138.65; 129.25; 123.71; 123.37; 112.50; 110.30; 62.01; 61.94; 37.26; 37.24; 25.88; 24.50; 16.37; 16.31.

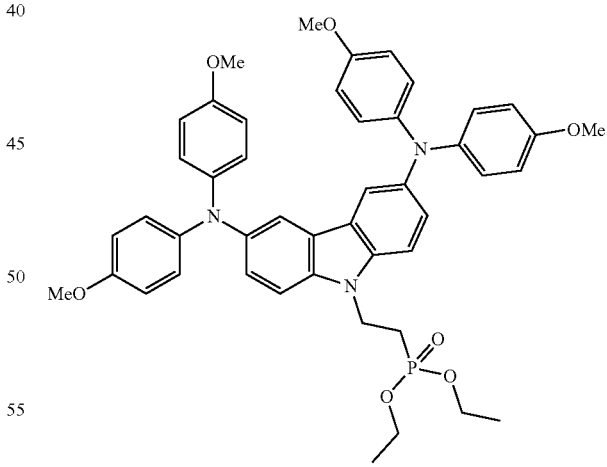

diethyl (2-{3,6-bis[bis(4-methoxyphenyl)amino]-9H-carbazol-9-yl}ethyl)phosphonate (3)

A solution of compound 2 (1 g, 2.04 mmol) and 4,4'-dimethoxydiphenylamine (1.37 g, 6.13 mmol) in anhydrous toluene (50 mL) was purged with argon for 20 min. Afterward, palladium(II) acetate (0.137 g, 0.613 mmol), tri-tert-butylphosphonium tetrafluoroborate (0.35 g, 1.23 mmol), and sodium tert-butoxide (0.59 g, 6.13 mmol) were added and the solution was refluxed under argon atmosphere for 5 h. After completion (TLC, acetone:n-hexane, 2:3, v:v) reaction mixture was filtered through Celite. The solvent was removed under reduced pressure and the crude product was purified by column chromatography using acetone:n-hexane, 7:18, v:v as eluent to give 1 g (62.5%) of greenish powder—compound 3

Anal. calculated for $C_{46}H_{48}N_3O_7P$, %: C, 70.30; H, 6.16; N, 5.35, found, %: C, 70.14; H, 6.29; N, 5.56.

$^1$H NMR (400 MHz, DMSO-d6) δ 7.64 (d, J=2.2 Hz, 2H), 7.46 (d, J=8.7 Hz, 2H), 7.11 (dd, J=8.7, 2.2 Hz, 2H), 6.86-6.74 (m, 16H), 4.56-4.44 (m, 2H), 3.92 (p, J=7.2 Hz, 4H), 3.67 (s, 12H), 2.33-2.20 (m, 2H), 1.12 (t, J=7.0 Hz, 6H).

$^{13}$C NMR (101 MHz, DMSO) δ 154.16, 142.08, 140.25, 136.67, 124.39, 123.67, 122.90, 116.94, 114.60, 110.28, 61.20, 61.14, 55.15, 28.62, 16.13, 16.07.

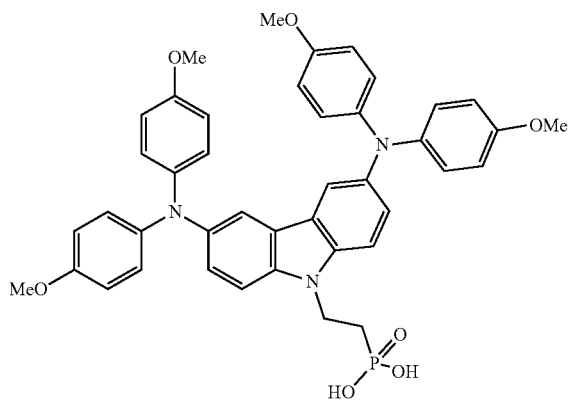 [SMILES: COc1ccc(N(c2ccc(OC)cc2)c2ccc3c(c2)c2cc(N(c4ccc(OC)cc4)c4ccc(OC)cc4)ccc2n3CCP(=O)(O)O)cc1]

(2-{3,6-bis[bis(4-methoxyphenyl)amino]-9H-carbazol-9-yl}ethyl)phosphonic acid (V1036)

Compound 3 (0.4 g, 0.51 mmol) was dissolved in dry 1,4-dioxane (15 ml) under argon. Afterwards, bromotrimethylsilane (0.67 ml, 5.08 mmol) was added dropwise. Reaction was kept for 24 h at 25° C. under argon atmosphere. Afterwards solvent was distilled off under reduced pressure, solid residue was dissolved in methanol (10 ml) and distilled water was added dropwise (10 ml), until solution became opaque, and was stirred for 15 h. Product was filtered off and washed with water to give 0.321 g (86%) of greenish powder—compound V1036

Anal. calculated for $C_{42}H_{40}N_3O_7P$, %: C, 69.13; H, 5.52; N, 5.76, found, %: C, 68.89; H, 5.38; N, 5.53.

$^1$H NMR (400 MHz, DMSO-d$_6$) δ 7.64 (s, 2H), 7.42 (d, J=8.8 Hz, 2H), 7.11 (d, J=8.6 Hz, 2H), 6.87-6.74 (m, 16H), 4.50-4.44 (m, 2H), 3.67 (s, 12H), 2.11-1.96 (m, 2H).

$^{13}$C NMR (100 MHz, DMSO-d6) δ 154.16; 142.09; 140.22; 136.66; 124.60; 123.66; 122.88; 117.15; 114.63; 110.01; 66.36; 55.16.

Synthesis route for the first additional compound in the scope of the invention:

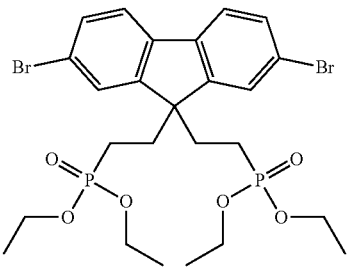 [SMILES: CCOP(=O)(CCC1(CCP(=O)(OCC)OCC)c2cc(Br)ccc2-c2ccc(Br)cc21)OCC]

tetraethyl [(2,7-dibromo-9H-fluorene-9,9-diyl)di(ethane-2,1-diyl)]bis(phosphonate) (4)

2,7-dibromofluorene (1 g, 3.08 mmol) was dissolved in 1,4-dioxane (30 ml), diethyl-2-bromoethylphosphonate (1.55 ml, 9.25 mmol) was added dropwisely, and every 10 min three portions of sodium tert-butoxide (1.18 g, 12.34 mmol) was added. Reaction mixture is stirred for 3 h, every 1 h raising temperature by 20° C. (from 30° C. to 70° C.). After completion of the reaction (TLC acetone:n-hexane, 7:18, v:v), extraction was done with diethyl ether. The organic layer was dried over anhydrous $Na_2SO_4$ and the solvent was distilled off under reduced pressure. The crude product was purified by column chromatography using acetone:n-hexane, 7:18, v:v as eluent to give 1.25 g (62%) of white crystalline material—compound 4:

Anal. calculated for $C_{25}H_{34}Br_2O_6P_2$, %: C, 46.03; H, 5.25, found, %: C, 45.87; H, 5.12.

$^1$H NMR (400 MHz, CDCl$_3$) δ 7.53 (s, 2H); 7.52 (d, J=1.6 Hz, 2H); 7.46 (d, J=1.3 Hz, 2H); 4.08-3.87 (m, 8H); 2.32-2.20 (m, 4H); 1.26 (t, J=7.1 Hz, 12H); 1.02-0.88 (m, 4H).

$^{13}$C NMR (175 MHz, CDCl$_3$) δ 138.64; 129.24; 123.70; 123.35; 112.49; 110.29; 61.99; 61.95; 37.24; 37.24; 25.59; 24.80; 16.36; 16.33.

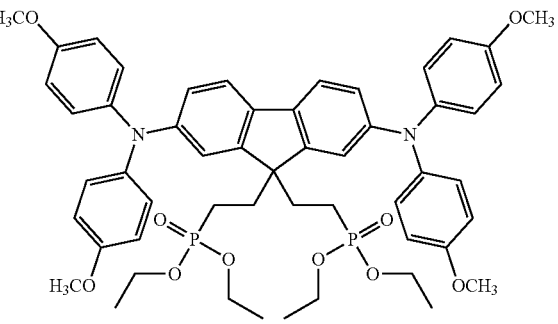

tetraethyl [{2,7-bis[bis(4-methoxyphenyl)amino]-9H-fluorene-9,9-diyl}di(ethane-2,1-diyl)]bis(phosphonate) (5)

A solution of compound 4 (1 g, 1.53 mmol) and 4,4'-dimethoxydiphenylamine (1.05 g, 4.59 mmol) in anhydrous toluene (50 mL) was purged with argon for 20 min. Afterward, palladium(II) acetate (0.10 g, 0.46 mmol), tri-tert-butylphosphonium tetrafluoroborate (0.28 g. 0.95 mmol), and sodium tert-butoxide (0.44 g, 4.59 mmol) were added and the solution was refluxed under argon atmosphere for 6 h. After completion (TLC, acetone:n-hexane, 2:3, v:v) reaction mixture was filtered through Celite. The solvent was removed under reduced pressure and the crude product was purified by column chromatography using acetone:n-hexane, 7:18, v:v as eluent to give 0.9 g (62%) of yellow solid—compound 5:

Anal. calculated for $C_{53}H_{62}N_2O_{10}P_2$, %: C, 67.08; H, 6.58; N, 2.95, found, %: C, 67.31; H, 7.09; N, 2.79.

$^1$H NMR (700 MHz, CDCl$_3$) δ 7.30 (dd, J=16.8, 9.4 Hz, 2H); 7.26 (s, 1H); 7.24-6.71 (m, 19H); 3.96 (p, J=7.2 Hz, 8H); 3.80 (s, J=14.1 Hz, 12H); 1.99 (dd, J=16.6, 7.2 Hz, 4H); 1.25 (t, J=7.1 Hz, 12H); 1.13-1.05 (m, 4H).

$^{13}$C NMR (100 MHz, CDCl$_3$) δ 155.85; 146.59; 141.60; 141.04; 127.85; 126.38; 122.47; 120.62; 119.17; 114.76; 61.44; 61.41; 61.37; 55.48; 54.85; 54.75; 54.64; 32.23; 32.21; 29.70; 20.84; 20.04; 16.45; 16.41.

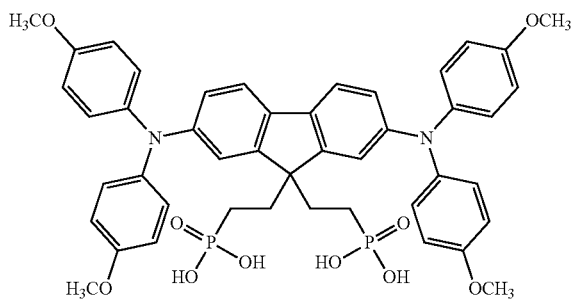 [SMILES: COc1ccc(N(c2ccc(OC)cc2)c2ccc3c(c2)C(CCP(=O)(O)O)(CCP(=O)(O)O)c2cc(N(c4ccc(OC)cc4)c4ccc(OC)cc4)ccc2-3)cc1]

[{2,7-bis[bis(4-methoxyphenyl)amino]-9H-fluorene-9,9-diyl}di(ethane-2,1-diyl)]bis(phosphonic acid) (6)

Compound 5 (0.88 g, 0.93 mmol) was dissolved in dry 1,4-dioxane (20 ml) under argon. Afterwards, bromotrimethylsilane (1.96 ml, 14.88 mmol) was added dropwise. Reaction was kept for 20 h at 25° C. under argon atmosphere. Afterwards solvent was distilled off under reduced pressure, solid residue was dissolved in methanol (10 ml) and distilled water was added dropwise (20 ml), until solution became opaque, and was stirred for 3 h. Product was filtered off and washed with water to give 0.230 g (80%) of reddish powder—compound 6

Anal. calcd for $C_{45}H_{46}N_2O_{10}P_2$, %: C, 64.59; H, 5.54; N, 3.35, found, %: C, 64.56; H, 5.67; N, 3.48.

$^1$H NMR (400 MHz, d8-THF) δ 7.34 (d, J=8.3 Hz, 2H); 7.19 (d, J=1.2 Hz, 2H); 7.02 (d, J=8.9 Hz, 8H); 6.80 (d, J=8.9 Hz, 8H); 6.74 (dd, J=8.2, 1.7 Hz, 2H); 3.71 (s, J=11.7 Hz, 12H); 2.09 (d, J=7.5 Hz, 4H); 0.99-0.85 (m, 4H).

$^{13}$C NMR (100 MHz, d8-THF) δ 155.78; 148.68; 147.61; 141.09; 134.71; 125.67; 120.66; 118.88; 115.96; 114.59; 54.65, 31.70; 28.37.

Synthesis route for the second additional compound, V1193, in the scope of the invention

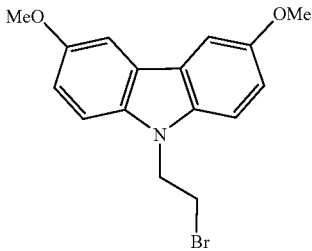 [SMILES: COc1ccc2c(c1)c1cc(OC)ccc1n2CCBr]

9-(2-Bromoethyl)-3,6-dimethoxy-9H-carbazole (7) 3,6-Dimethoxycarbazole (0.534 g, 2.35 mmol) was dissolved in an aqueous solution (6.9 ml) of 1,2-dibromoethane (8 ml) and tetrabutylammonium bromide (0.08 g, 0.25 mmol) whereas 50% aqueous solution of KOH has been added. The solution was stirred at 70° C. for 20 h until completion (TLC, acetone: n-hexane, 3:22, v: v). After the completion of the reaction, extraction was carried out with ethyl acetate. The obtained organic layer was dried over anhydrous Na$_2$SO$_4$, and the solvent was distilled off under reduced pressure. The crude product obtained in this way was purified by means of column chromatography using acetone: n-hexane, 1:49, v: v as the eluent. 0.352 g (60%) of crystalline, white material—compound 7 were obtained.

Anal. calcd for $C_{16}H_{16}O_2NBr$, %: C, 57.50; H, 4.83; N, 4.19; found, %: C, 57.39; H, 4.86; N, 4.15.

1H NMR (400 MHz, CDCl$_3$) δ 7.51 (d, J=2.5 Hz, 2H), 7.29 (d, J=8.8 Hz, 2H), 7.10 (dd, J=8.8, 2.5 Hz, 2H), 4.62 (t, J=7.5 Hz, 2H), 3.93 (s, 6H), 3.62 (t, J=7.5 Hz, 2H).

13C NMR (101 MHz, CDCl$_3$) δ 153.85, 135.65, 123.39, 115.30, 109.41, 103.45, 56.27, 45.07, 28.55

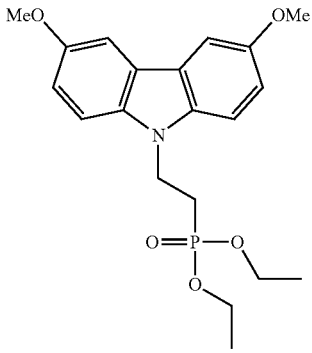 [SMILES: CCOP(=O)(CCn1c2ccc(OC)cc2c2cc(OC)ccc21)OCC]

Diethyl [2-(3,6-dimethoxy-9H-carbazol-9-yl) ethyl] phosphonate (8)

Compound 10 (0.316 g, 0.95 mmol) was dissolved in triethyl phosphite (2.7 ml) and refluxed for 18 hours. After the reaction had ended (TLC, acetone: n-hexane, 1:4, v: v) the solvent was distilled off under reduced pressure. The crude product, in turn, was purified by column chromatography with acetone: n-hexane, 1:1, v:v as eluent and gave 0.353 g (95%) of clear liquid—compound 8.

Anal. calcd for $C_{20}H_{26}NO_5P$, %: C, 61.37; H, 6.70; N, 3.58; found, %: C, 61.32; H, 6.73; N, 3.55.

1 H NMR (400 MHz, CDCl$_3$) δ 7.52 (d, J=2.5 Hz, 2H), 7.30 (d, J=8.8 Hz, 2H), 7.10 (dd, J=8.8, 2.5 Hz, 2H), 4.60-449 (m, 2H), 4.09-4.03 (m, 4H), 3.93 (s, 6H), 2.29-2.15 (m, 2H), 1.28 (t, J=7.1 Hz, 6H).

13C NMR (101 MHz, CDCl$_3$) δ 153.67, 135.46, 123.37, 115.20, 109.49, 103.46, 62.02, 61.96, 56.28, 37.31, 26.15, 24.79, 16.56, 16.50.

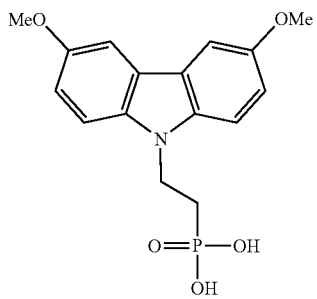 [SMILES: COc1ccc2c(c1)c1cc(OC)ccc1n2CCP(=O)(O)O]

2-(3,6-dimethoxy-9H-carbazol-9-yl) ethyl] phosphonic acid (V1193)

Compound 11 (0.335 g, 0.86 mmol) was dissolved in anhydrous 1,4-dioxane (25 ml) under an argon atmosphere. Bromotrimethylsilane (1.12 ml) was then added dropwise. The reaction was held for 24 h at 25° C. under an argon atmosphere. The solution was then distilled off under reduced pressure, and the solid residue was dissolved in methanol (15 ml) and distilled water (30 ml) was added dropwise until the solution became opaque and stirred for 15 hours. The product was filtered off and washed with water, from which 0.230 g (80%) of a beige solid resulted—V1193.

Anal. calcd for C$_{16}$H$_{18}$NO$_5$P, %: C, 57.32; H, 5.41; N, 4.18, found, %: C, 57.19; H, 5.53; N, 4.11.

1 H NMR (400 MHz, MeOD) δ 7.57 (d, J=2.5 Hz, 2H), 7.34 (d, J=8.8 Hz, 2H), 7.05 (dd, J=8.8, 2.5 Hz, 2H), 4.58-4.48 (m, 2H), 3.87 (s, 6H), 2.20-2.06 (m, 2H).

13C NMR (101 MHz, MeOD) δ 154.97, 136.71, 124.61, 116.03, 110.37, 104.29, 62.39, 56.46, 38.47. The synthesis route for the third additional compound, V1194, within the scope of the invention results from the synthesis route for the V1193 (see above) with the difference that 9H-carbazole is used instead of 3,6-dimethoxycarbazole.

A preferred example of the desired product can be formulated as follows:

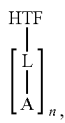

where HTF is hole transporting fragment, L—linking fragment, A—anchor group, n=1-2 A—phosphonic acid, phosphoric acid, sulfuric acid, sulfonic acid, carboxylic acid, siloxanes etc.

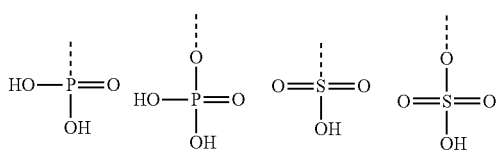

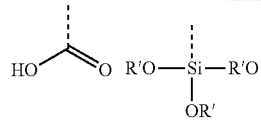

R'—Hydrogen, C1-C9 alkyl group

L—C1-C9 alkylene, C4-C20 arylene, C4-C20 heteroarylene, C4-C20 alkylarylene, C4-C20 heteroalkylarylene heteroatoms being selected from O, N, S, Se, Si, wherein said alkylene, arylene, heteroarylene, alkylarylene, heteroalkylarylene, if they comprise 3 or more carbons, may be linear, branched or cyclic e.g.:

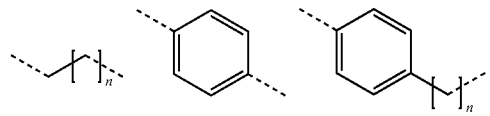

HTF:

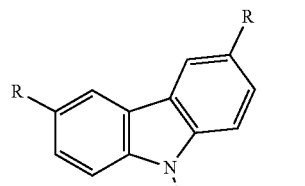

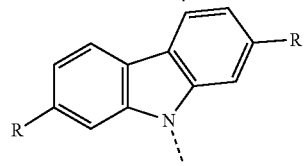

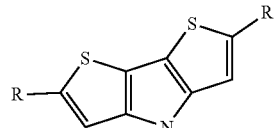

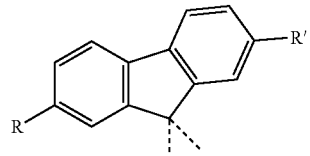

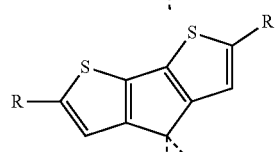

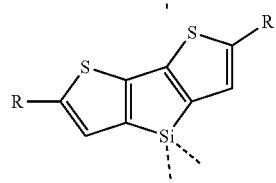

-continued

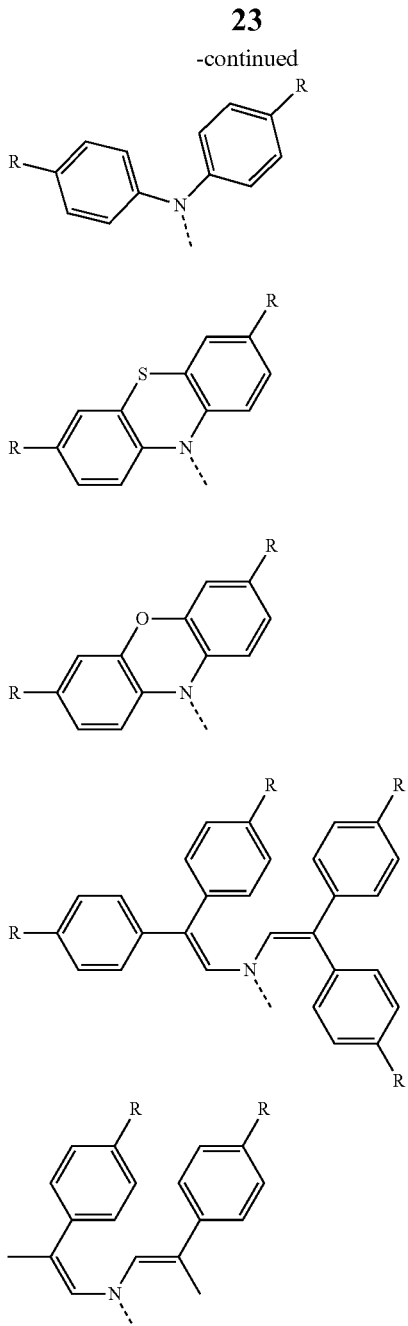

R:
Hydrogen

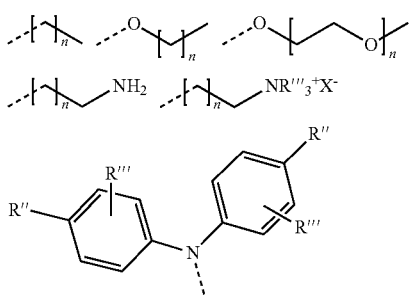

-continued

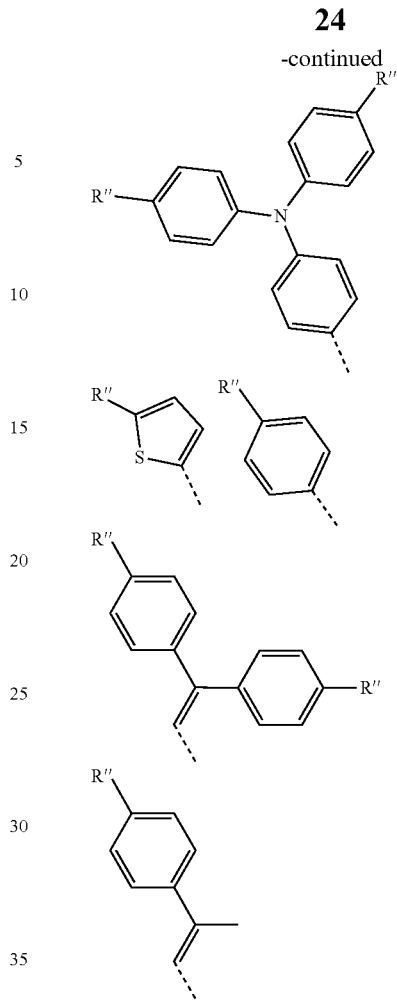

X—halogen (F, Cl, Br, I)
R′′′: hydrogen, alkyl (C1-C12)
R′′: hydrogen, alkyl, alkoxy (—$CH_3$; —$OCH_3$)

V1036, as well as mixed V1036 and n-butylphosphonic acid (C4) SAMs were formed by immersing UV-ozone treated ITO substrates into 1 mM solution of phosphonic acid molecules, dissolved in isopropanol, for 20 h, followed by annealing at 100° C. for 1 h and subsequent washing with isopropanol and chlorobenzene. To exclude any possible negative impact of atmospheric oxygen all procedures were done in a nitrogen-filled glovebox.

The V1193 in a solution was rotated onto ITO substrates and then annealed at 100° C. for 10 minutes. Washing is optional in this case. The V1193 shows the V1036 improved properties, as can also be seen in FIG. 10.

In FIG. 10, the parameters of the efficiency in % (Δ, values related to the left outer ordinate, with error bars), the quasi Fermi level splitting (QFLS) in eV (●, values related to the left inner ordinate), the open circuit voltage VOC in volts (★, values also related to the left inner ordinate, with error bar) and the lifetimes of the photoluminescence in µs (bar □, values related to the right ordinate) of "triple cation" perovskite absorber $(Cs_5(MA_{17}FA_{83}Pb(I_{83}Br_{17}))_3)_{95})$ applied to various HTM-SAMs according to the invention, V1036, V1193, V1194 and for comparison also to PTAA, are compared in a diagram. The data where derived from a component analysis. The measured parameters were determined with a lighting intensity equivalent to a sun (AM1.5g standard). The bars show the longest measured photoluminescence lifetimes. The area between the curved solid lines indicates the maximum and minimum QFLS values that were measured (from 3 V1036 samples, 8 V1193 samples, and 9 V1194 samples). The error bars for the open circuit voltage VOC and the efficiencies indicate the standard deviation of measurements on 38 V1036 cells, 56 PTAA cells, 42 V1193 cells and 40 V1194 cells. A clear correlation between efficiency, VOC, photoluminescence (PL) lifetimes and QFLS can be seen. The SAMs V1193 and V1194 surpass PTAA, the current standard in highly efficient inverted perovskite solar cells, in PL lifetime, QFLS and device performance. The values for V1036 come close to those of the PTAA. The dashed line indicates the PL life on glass as a reference. Advantageous, and not included in the picture, the HTM-SAMs according to the invention are significantly more cost-effective than PTAA.

In this work for the first time a hole transporting SAM was specified which could be used in the p-i-n architecture PSC device, showing overall efficiency close to 18% and more. Moreover due to the (covalent) linking to the substrate layers, layers formed by these SAMs are tolerant against perovskite processing and could potentially cover conformally on every textured oxide surface. With that, these molecules are perfect for a direct integration of monolithic perovskite/silicon solar cells on textured silicon wafers.

In addition, the new HTM based on the fragments described above can potentially be extended to serve as a model system for substrate-based perovskite nucleation and passivation control.

The research work on this project was financially supported by the Horizon 2020 EU funding program under Grant Agreement No. 763977 of the PerTPV project

LIST OF ABBREVIATIONS

| PCE | power conversion efficiency |
|---|---|
| PSC | perovskite solar cell |
| TCO | transparent conductive oxide |
| HTM | hole transporting material |
| FF | fill factor |
| Voc | open-circuit voltage |
| ITO | indium tin oxide |
| SAM | self assembling monolayer |
| HTF | hole transporting fragment |
| FM | filler molecule |
| THF | tetrahydrofuran |
| PTAA | Poly(triaryl ammin) |
| EQE | external quantum efficiency |
| FTIR | Fourier-transform infrared spectroscopy |
| VSFG | Vibrational sum-frequency generation |
| BCP | bathocuproin |
| TLC | Thin layer chomatography |

The invention claimed is:

1. A compound made up of at least one kind of molecule according to formula (I) optionally mixed up with a filler molecule FM given by

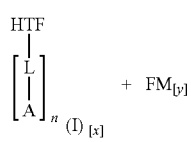

where L is a linking fragment, A is an anchor group, n is 1 or 2, and HTF is a hole transporting fragment being selected from any of the following formula II or III, $$\text{a polycycle Z-D-Z} \tag{II}$$

wherein
a. both groups Z, and D are homocyclic;
b. Z is a $C_5$ or $C_6$ substituted or unsubstituted aromatic group, and D is N;
c. Z is a $C_5$ or $C_6$ substituted or unsubstituted aromatic group, and include a heteroatom selected from the group consisting of N, S, O and Si, and D is N;
d. Z is a $C_5$ or $C_6$ substituted or unsubstituted aromatic group and D is a $C_5$ or $C_6$ cyclic group; and each of the groups Z and D includes a heteroatom selected from the group consisting of N, S, O, Si;
e. Z is $C_5$ or $C_6$ substituted or unsubstituted aromatic group and D is $C_5$ or $C_6$ cyclic group; and D includes a heteroatom selected from the group consisting of N, S, O, Si; or
f. Z is a $C_5$ or $C_6$ substituted or unsubstituted aromatic groups and include a heteroatom selected from the group consisting of N, S, O, Si, and D is a $C_5$ or $C_6$ cyclic group;

wherein, when D is a $C_5$ or $C_6$ cyclic group, two neighbored carbon atoms of cyclic group D are each bonded to one of the two aromatic groups Z, and two neighbored carbon atoms of cyclic group D are each bonded to the remaining aromatic group Z to form a tricycloundecane, a tricyclotridecane or a tricyclotetradecane derivative; or

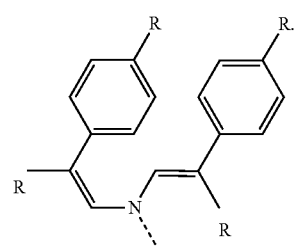

(III)

with R is a substituent
and the optional FM is at least one kind of molecule consisting of an anchoring group, an alkyl chain of N carbon atoms, with N is in the range of 1 to 18, and a functional group of at least one of the group methyl, halogen, amino, ammonium and sulfuric functional group and where x is in the range of 0.02 to 1 and y equals (1−x).

2. Compound according to claim 1, wherein D is a C5- or C6-heteroaromatic group, wherein the heteroatom is selected from N, Si, S and O.

3. Compound according to claim 1, wherein the hole transport fragment HTF is selected from any one of formula IV to XIV

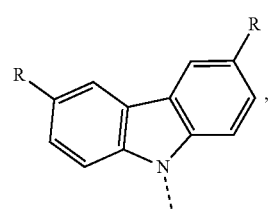

(IV)

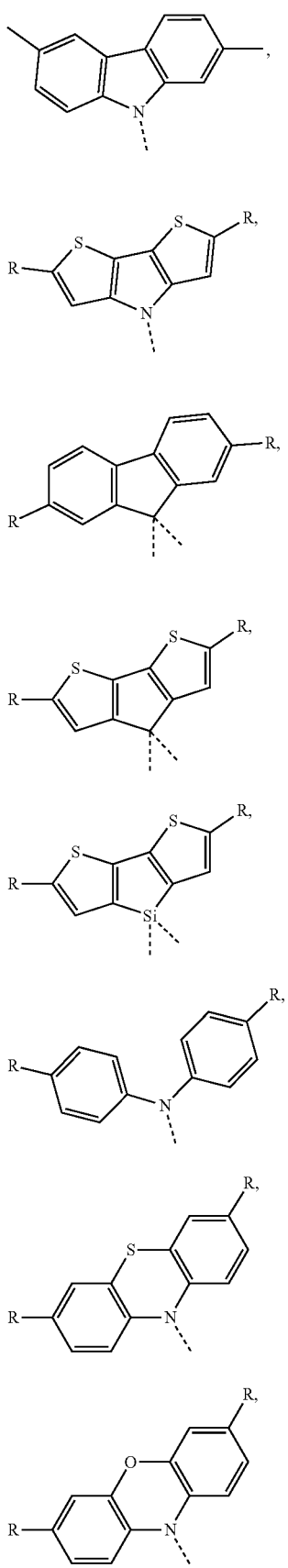

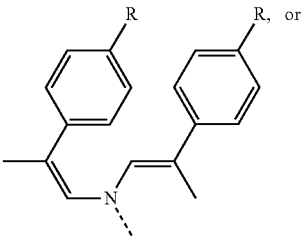

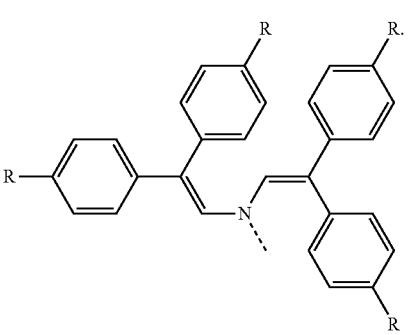

4. Compound according to claim 1, wherein x=1 and y=0 and wherein A is a phosphonic acid group and L is a C2, and wherein HTF is selected from the formula (II) with D is N and Z is a C6-cyclic, aromatic group which is substituted with a methoxy group.

5. A compound according to claim 1, wherein x=1 and y=0 and wherein A is a phosphonic acid group and L is a C2, and wherein HTF is selected from the formula (II) with D is N and Z is a C6-cyclic, aromatic group.

6. Compound according to claim 1, wherein the hole transport fragment HTF is selected from any one of formula IV, V or VII

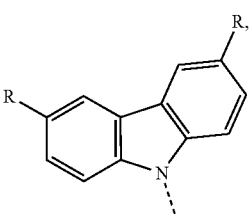

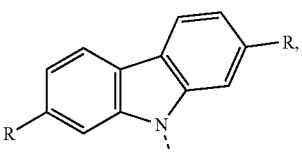

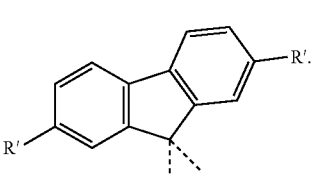

7. Compound according to claim 1, wherein the hole transport fragment HTF is selected from any one of formula IV or VII

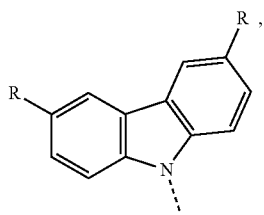
(IV)

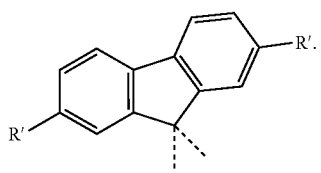
(VII)

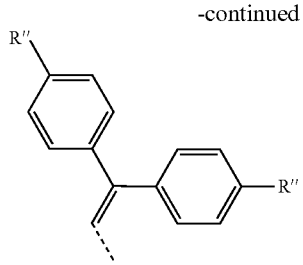

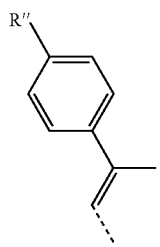

wherein the dotted lines represent the bond by which R is connected to HTF,

X is selected from the group consisting of halogens F, Cl, Br, and I,

R''' is selected from the group consisting of hydrogen, alkyl ($C_1$-$C_{12}$), and R'' is selected from the group consisting of hydrogen, alkyl, and alkoxy (—$CH_3$; —$OCH_3$).

8. Compound according to claim 1, wherein n is 1 or 2.

9. Compound according to claim 1, wherein A is an anchor group selected from the group consisting of phosphonic acid, phosphoric acid, sulphuric acid, sulphonic acid and siloxanes.

10. Compound according to claim 1, wherein R is independently selected from the group consisting of H; $C_1$-$C_{10}$-alkyl; $C_2$-$C_{10}$-alkenyl; $C_3$-$C_{20}$-cycloalkyl; $C_3$-$C_5$-heterocloalkyl, alkoxy, aryloxy, alkylthio, arylthio, amino, amido, ester, carboxylic acid, di-alkoxy diphenylamine, carbamate, urea, ketone, aldehyde, cyanide, nitro, halogen; (cycloalkyl)alkyl and (heterocycloalkyl)alkyl.

11. Compound according to claim 1, wherein R is independently selected from the group consisting of hydrogen, and any one of the moieties

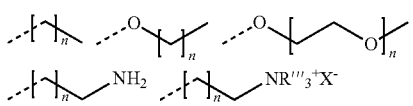

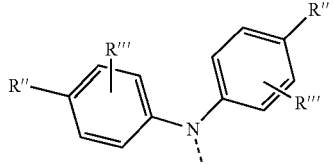

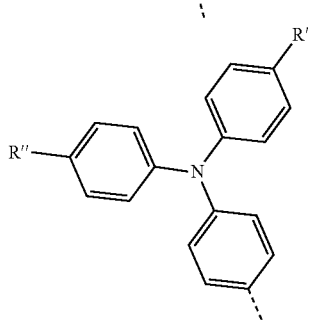

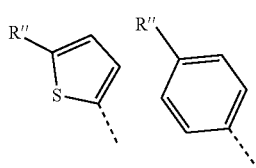

12. Method for the formation of self-assembling monolayers on transparent conductive oxide (TCO) substrates, of Perovskite solar cells in inverted architecture, the method comprising the steps:

providing a substrate covered with an oxide layer immersing the substrate in a solution comprising a solvent and a compound according to

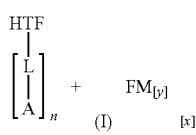
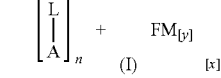

where L is a linking fragment, A an anchor group and HTF is a hole transporting fragment being selected from any of the following formula II or III, a polycycle Z-D-Z (II), wherein Z is a homocyclic $C_5$ or $C_6$ substituted or unsubstituted aromatic group and D is N or a homocyclic $C_5$ or $C_6$ cyclic group; or at least one of Z or D includes a heteroatom selected from the group consisting of N, S, O, and Si, and wherein two neighbored carbon atoms of cyclic group D are each bonded to one of the two aromatic groups Z and two neighbored carbon atoms of cyclic group D are each bonded to the remaining aromatic group Z to form a tricycloundecane, a tricyclotridecane or a tricyclotetradecane derivative; or

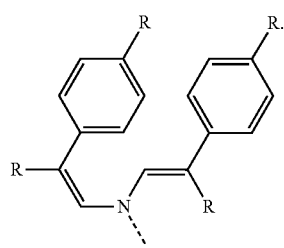 (III)

with R is a substituent
and wherein filler molecule (FM) is optional and is at least one kind of molecule consisting of an anchoring group, an alkyl chain of N carbon atoms, with N is in the range of 1 to 18, and a functional group of at least one of the group methyl, halogen, amino, ammonium and sulfuric functional group and where x is in the range of 0.02 to 1 and y equals (1−x), by immersing the substrate in a solution comprising a solvent and the compound or spin-coating the compound in a solution on the substrate.

13. The method of claim 12, wherein the compound is rotated on to the oxide layer by spin coating.

14. A method according to claim 13 wherein the substrate is subsequently thermally annealed and/or washed.

15. A method according to claim 12, wherein the substrate is subsequently thermally annealed and/or washed.

* * * * *